(12) United States Patent
Hsiao et al.

(10) Patent No.: US 10,181,378 B2
(45) Date of Patent: Jan. 15, 2019

(54) MAGNETIC CORE INDUCTOR CHIP AND METHOD OF MAKING THE SAME

(71) Applicant: Wafer Mems Co., LTD., Miaoli County (TW)

(72) Inventors: Min-Ho Hsiao, Miaoli County (TW); Pang-Yen Lee, Miaoli County (TW); Yen-Hao Tseng, Miaoli County (TW)

(73) Assignee: WAFER MEMS CO., LTD, Miaoli County (TW)

( * ) Notice: Subject to any disclaimer, the term of this patent is extended or adjusted under 35 U.S.C. 154(b) by 53 days.

(21) Appl. No.: 15/152,809

(22) Filed: May 12, 2016

(65) Prior Publication Data

US 2016/0379749 A1 Dec. 29, 2016

(30) Foreign Application Priority Data

Jun. 25, 2015 (TW) .............................. 104120531 A

(51) Int. Cl.
*B44C 1/22* (2006.01)
*H01F 41/04* (2006.01)
*H01L 21/70* (2006.01)
*H01L 27/22* (2006.01)
*H01F 17/04* (2006.01)
*H01L 27/01* (2006.01)
*H01F 17/00* (2006.01)

(52) U.S. Cl.
CPC ....... *H01F 41/042* (2013.01); *H01F 17/0033* (2013.01); *H01F 17/04* (2013.01); *H01L 21/705* (2013.01); *H01L 27/016* (2013.01); *H01L 27/222* (2013.01)

(58) Field of Classification Search
CPC ... H01L 21/705; H01L 27/016; H01L 27/222; H01F 17/04; H01F 41/0206
USPC ......................................... 216/22, 54, 74, 75
See application file for complete search history.

(56) References Cited

U.S. PATENT DOCUMENTS

| | | | |
|---|---|---|---|
| 2004/0169576 A1 | 9/2004 | Waffenschmidt | |
| 2010/0127405 A1* | 5/2010 | Kikuchi | H01L 21/6835 257/776 |
| 2015/0036308 A1* | 2/2015 | Stucken | H05K 1/115 361/782 |
| 2015/0187488 A1* | 7/2015 | Williams | H05K 3/061 336/192 |

(Continued)

FOREIGN PATENT DOCUMENTS

| | | |
|---|---|---|
| CN | 1179609 | 4/1998 |
| CN | 1220472 | 6/1999 |

(Continued)

OTHER PUBLICATIONS

Search Report in Taiwanese Patent Application No. 104120531 dated Feb. 15, 2017, with English translation. 2 pages.

(Continued)

*Primary Examiner* — Binh X Tran
(74) *Attorney, Agent, or Firm* — Womble Bond Dickinson (US) LLP

(57) ABSTRACT

A magnetic core inductor chip includes a core and a coil. The core is in the form of a single piece of a magnetic material. The coil is deposited on and surrounds the core and has structural characteristics indicative of the coil being formed on the core by deposition techniques. Methods for making the magnetic core inductor chip are also disclosed.

12 Claims, 37 Drawing Sheets

(56) References Cited

U.S. PATENT DOCUMENTS

2016/0284630 A1* 9/2016 Levander .............. B32B 27/283
2016/0307991 A1* 10/2016 Kuo ........................ H01L 28/10
2016/0379747 A1* 12/2016 Wolter ................ H01F 17/0033
336/200

FOREIGN PATENT DOCUMENTS

| | | |
|---|---|---|
| CN | 1290947 | 4/2001 |
| CN | 204884757 | 12/2015 |
| JP | 2001102220 | 4/2001 |
| TW | 490689 B | 6/2002 |
| TW | 583691 B | 4/2004 |
| TW | M340537 U | 9/2008 |
| TW | 201216303 A1 | 4/2012 |

OTHER PUBLICATIONS

Wafer Mems Co., Ltd., "Search Report," for CN Application No. 2015104880039 (dated Sep. 26, 2017).

* cited by examiner

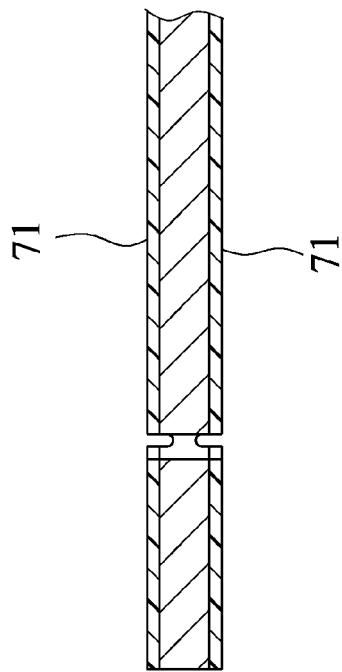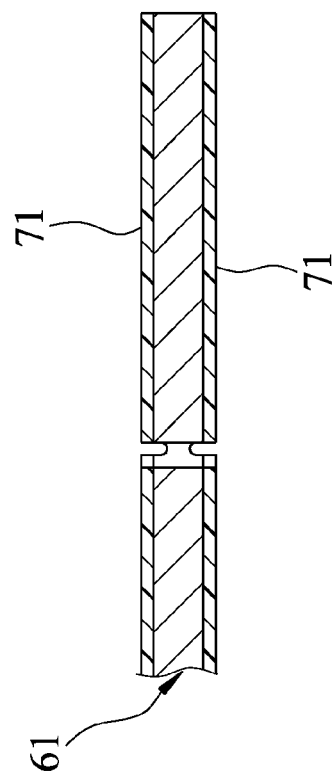
FIG.12

MAGNETIC CORE INDUCTOR CHIP AND METHOD OF MAKING THE SAME

CROSS-REFERENCE TO RELATED APPLICATION

This application claims priority of Taiwanese Application No. 104120531, filed on Jun. 25, 2015.

FIELD

The disclosure relates to an inductor chip and a method of making the same, more particularly to a magnetic core inductor chip with a core made from a magnetic material and a coil deposited on the core.

BACKGROUND

There are three types of inductors namely thin film type inductors, multilayered type inductors, and wire wound type inductors, which are commercially available.

TW patent NO. 1430300 discloses a multilayered type inductor which includes a plurality of insulator layers, and a plurality of patterned metal layers. The insulating layers and the patterned metal layers cooperatively define a core and a coil of the multilayered type inductor.

A method of making the multilayered type inductor includes steps of: plating the patterned metal layers on the corresponding insulating layers; forming holes in each of the insulating layers; and filling a conducting material into the holes such that the patterned metal layers are electroconnected to one another through the conducting material.

The aforesaid method is relatively complicated. In order to simplify the structure of the multilayered type inductor and the method of making the same, TW patent application publication No. 201440090 A discloses a magnetic multilayered type inductor (see FIG. 1) and a method of making the same.

The method of making the multilayered type inductor includes the steps of: laminating a first circuit plate 110, a second circuit plate 120, a third circuit plate 130 and a fourth circuit plate 140 (see FIG. 2A); attaching an assembly of a supporting film 150 and a bonding pad circuit 160 to the first circuit plate 110 (see FIG. 2B); transferring the bonding pad circuit 160 from the supporting film 150 to the first circuit plate 110 (see FIG. 2C); removing the supporting film 150 from the bonding pad circuit 160 (see FIG. 2D); sintering the first, second, third and fourth circuit plates 110, 120, 130, 140 and the bonding pad circuit 160 so as to form a multilayered substrate 100 (see FIG. 2E); and scribing the multilayered substrate 100 using a scriber 170 (see FIG. 2F), such that the multilayered substrate 100 can be broken into a plurality of multilayered type inductors 10 (see FIG. 1).

Referring to FIG. 1, each of the first, second, third and fourth circuit plates 110, 120, 130, 140 includes a respective one of non-magnetic bodies 111, 121, 131, 141 and a respective one of first, second, third and fourth circuit patterns 112, 122, 132, 142. Formation of the first, second, third and fourth circuit plates 110, 120, 130, 140 requires numerous steps (a total of at least 13 steps), including punching each non-magnetic body 111, 121, 131, 141 to form the holes, filling the conductive paste in the holes, forming the first, second, third and fourth circuit patterns 112, 122, 132, 142 and sintering, before laminating the first, second, third and fourth circuit plates 110, 120, 130, 140.

The magnetic multilayered inductor thus formed has undesired non-ohmic contact and Joule-heating, which may be induced at the interfaces between every two adjacent ones of the first, second, third and fourth circuit patterns 112, 122, 132, 142.

SUMMARY

Therefore, an object of the disclosure is to provide a magnetic core inductor chip that can alleviate at least one of the drawbacks of the prior art.

According to the disclosure, the magnetic core inductor chip includes a core and a coil.

The core is in the form of a single piece of a magnetic material.

The coil is deposited on and surrounds the core and has structural characteristics indicative of the first coil being formed on the core by deposition techniques.

Another object of the disclosure is to provide methods of making a magnetic core inductor chip that can overcome at least one of the aforesaid drawbacks of the prior art.

According to the disclosure, a method of making a magnetic core inductor chip includes:

forming at least one first patterned photoresist layer on a magnetic wafer such that the magnetic wafer has an etched portion exposed from the first patterned photoresist layer, the first patterned photoresist layer having a peripheral end part and at least one passive-component-defining unit, the passive-component-defining unit having a connecting part connected to the peripheral end part, a plurality of breaking-line-defining protrusions protruding from the connecting part, and a plurality of chip-defining parts;

etching the etched portion to pattern the magnetic wafer so as to form a magnetic patterned wafer; and removing the first patterned photoresist layer from the magnetic patterned wafer, such that the magnetic patterned wafer has a peripheral end portion and at least one passive-component unit that includes a connecting portion, a breaking line, and a plurality of spaced apart chip bodies, the connecting portion being connected to the peripheral end portion, the breaking line having a plurality of connecting tabs that are spaced apart from one another, each of the connecting tabs being disposed between and interconnecting the connecting portion and a respective one of the chip bodies;

forming a seed layer on each of the chip bodies of the magnetic patterned wafer, such that the seed layer is disposed on and around each of the chip bodies;

forming a second patterned photoresist layer on the seed layer on each of the chip bodies, such that the seed layer has a exposed region that is exposed from the second patterned photoresist layer, and a covered region that is covered with the seed layer;

depositing a metal layer on the exposed region of the seed layer so as to form a coil on and around each of the chip bodies of the magnetic patterned wafer through deposition techniques;

removing the covered region of the seed layer from the magnetic patterned wafer; and breaking the magnetic patterned wafer along the breaking line so as to form a plurality of magnetic core inductor chips.

According to the disclosure, another method of making a magnetic core inductor chip includes:

providing a punching die having a plurality of die holes that are arranged in an array;

punching a magnetic wafer using the punching die so as to form a magnetic patterned wafer that has a peripheral end portion and at least one core chip unit, the core chip unit including a connecting portion, a breaking line, and a plurality of spaced apart chip bodies, the connecting portion being connected to the peripheral end portion and being spaced apart from the chip bodies by a tab-accommodating space along a direction, the breaking line having a plurality of connecting tabs that are spaced apart from one another and that are disposed in the tab-accommodating space, each of the connecting tabs interconnecting the connecting portion and a respective one of the chip bodies;

forming a seed layer on each of the chip bodies of the magnetic patterned wafer, such that the seed layer is disposed on and around each of the chip bodies;

forming a patterned photoresist layer on the seed layer on each of the chip bodies, such that the seed layer has a exposed region that is exposed from the patterned photoresist layer, and a covered region that is covered with the patterned photoresist layer;

depositing a metal layer on the exposed region of the seed layer so as to form a coil on and around each of the chip bodies of the magnetic patterned wafer through deposition techniques;

removing the covered region of the seed layer from the magnetic patterned wafer; and breaking the magnetic patterned wafer along the breaking line so as to form a plurality of magnetic core inductor chips.

BRIEF DESCRIPTION OF THE DRAWINGS

Other features and advantages of the disclosure will become apparent in the following detailed description of the embodiments with reference to the accompanying drawings, of which:

FIG. 12 is a sectional view taken along line XII-XII of FIG. 11;

DETAILED DESCRIPTION

Figure 1:
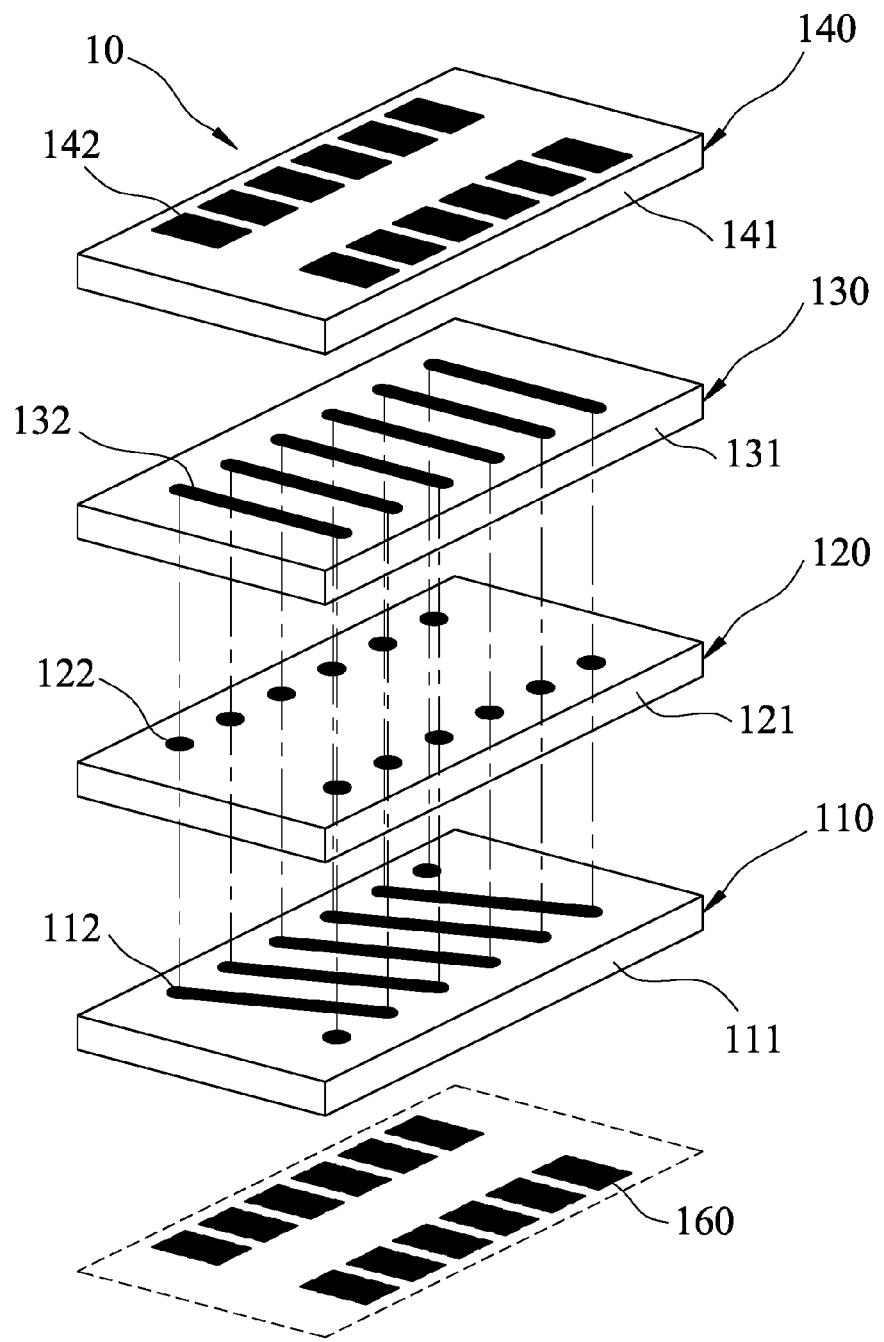
FIG. 1 is an exploded perspective view of a multilayered type inductor disclosed in TW patent application publication NO. 201440090 A.
Figure 2A:
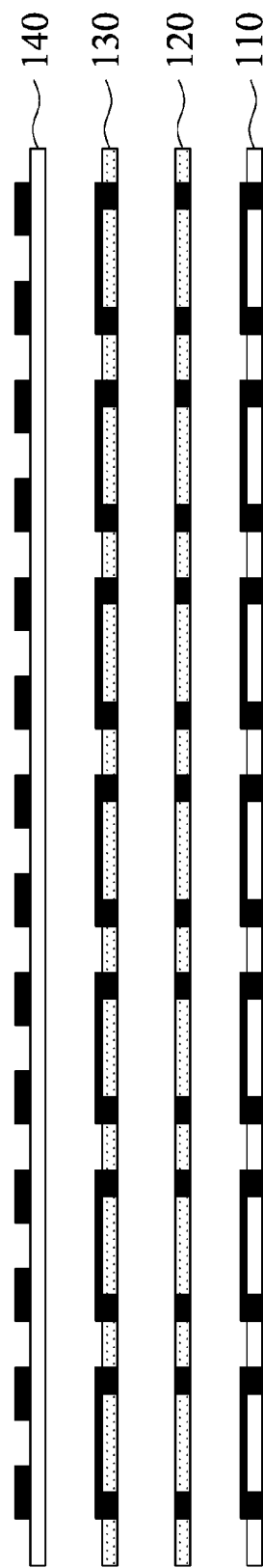
FIGS. 2A to 2F are sectional views illustrating consecutive steps of a method of making the multilayered type inductor of FIG. 1.
Figure 2B:
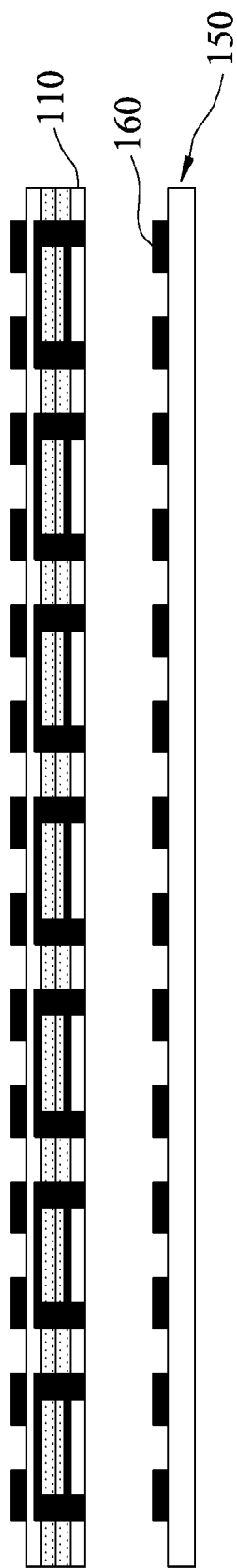
Figure 2C:
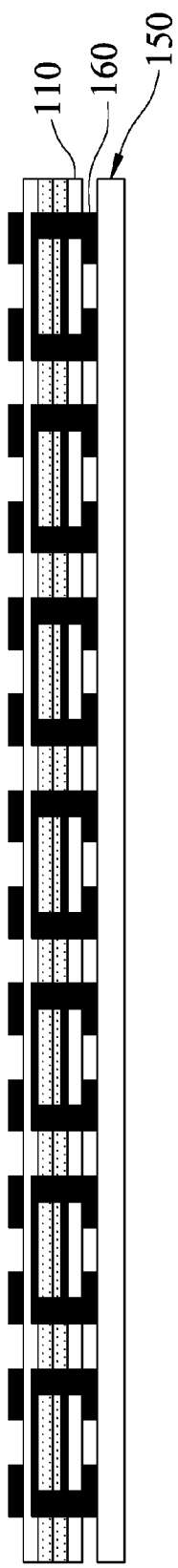
Figure 2D:
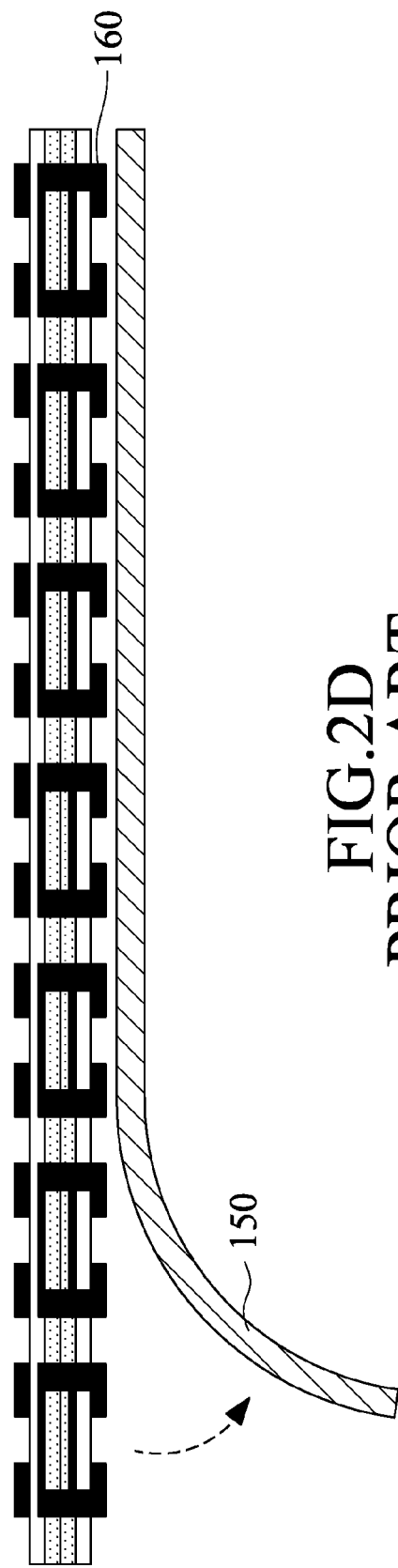
Figure 2E:
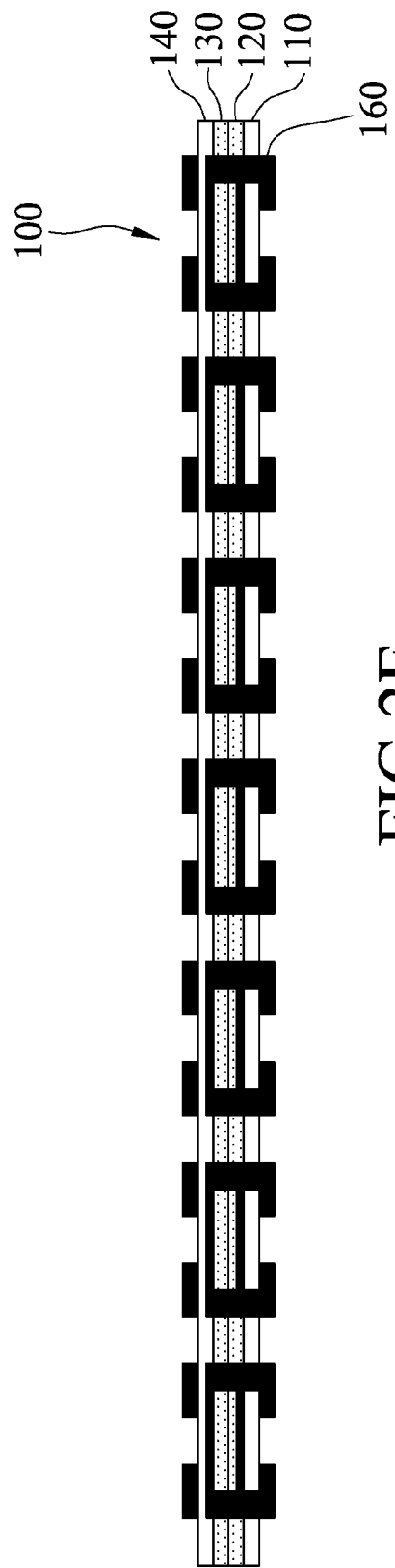
Figure 2F:
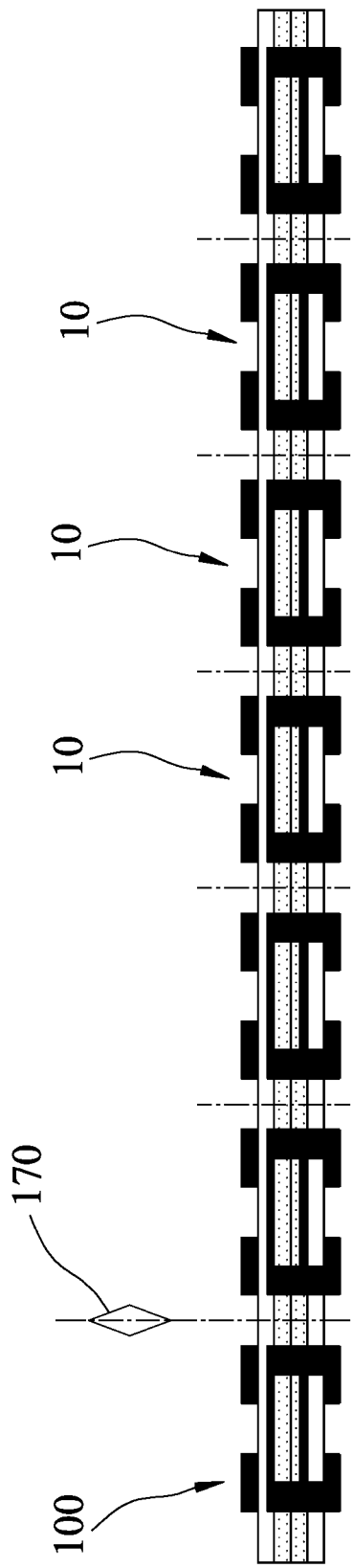

Before the disclosure is described in greater detail, it should be noted that like elements are denoted by the same reference numerals throughout the disclosure.

Figure 3:
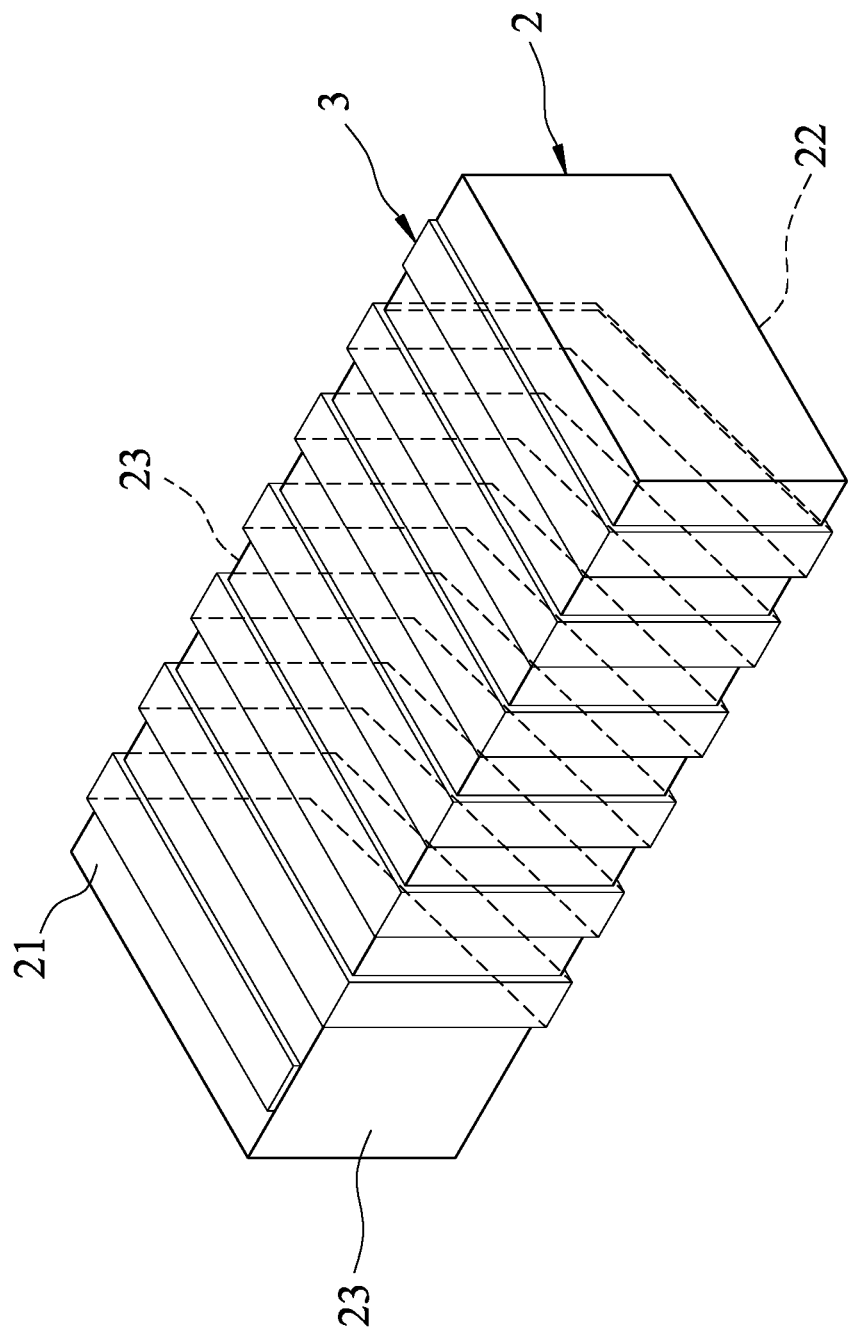
FIG. 3 is a perspective view illustrating the first embodiment of a magnetic core inductor chip according to the disclosure.

Referring to FIG. 3, a first embodiment of a magnetic core inductor chip according to the disclosure includes a core 2 and a first coil 3.

The core 2 is in the form of a single piece of a magnetic material.

The first coil 3 is deposited on and surrounds an outer surface of the core 2, and has structural characteristics indicative of the first coil 3 being formed on the core 2 by deposition techniques.

The core 2 further has top and bottom surfaces 21, 22, and two opposite side surfaces 23 extending from the top surface 21 to the bottom surface 22. The first coil 3 surrounds the top and bottom and side surfaces 21, 22, 23 of the core 2.

The magnetic material is selected from the group consisting of a magnetic metal material and a magnetic ceramic material. The magnetic metal material is selected from the group consisting of iron (Fe), cobalt (Co), and nickel (Ni). The magnetic ceramic material is, e.g., magnetite ($Fe_3O_4$) with an inverse spinel structure. Since the core 2 is a single piece, it has an excellent mechanical strength, and does not induce the non-ohmic contact as encountered in the prior art.

It should be noted that, in this embodiment, the core 2 may have a size ranging from 0.2 mm×0.1 mm×0.1 mm to 0.6 mm×0.3 mm×0.3 mm. In certain embodiments, the core 2 may have a size ranging from 0.2 mm×0.1 mm×0.1 mm to 0.4 mm×0.2 mm×0.2 mm.

In certain embodiments, the first coil 3 includes a first seed layer (not shown) deposited on the core 2, and a first metal layer (not shown) that is deposited on the first seed layer through deposition techniques, e.g., plating techniques.

Figure 4:
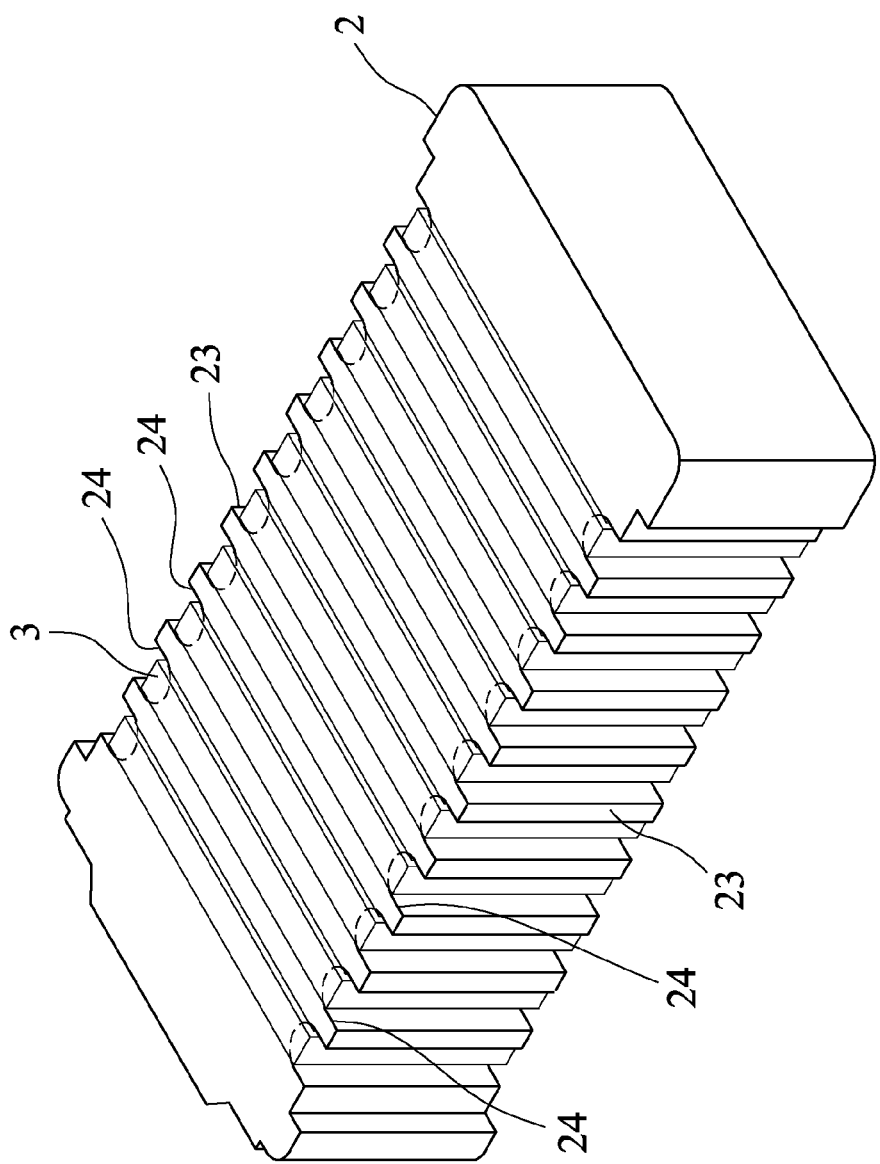
FIG. 4 is a perspective view illustrating the second embodiment of the magnetic core inductor chip according to the disclosure.

Referring to FIG. 4, a second embodiment of the magnetic core inductor chip according to the disclosure differs from the first embodiment in that the core 2 of the second embodiment further includes a plurality of spaced apart notches 24 that are indented inwardly from the side surfaces 23. The first coil 3 extends into and through the notches 24.

Figure 5:
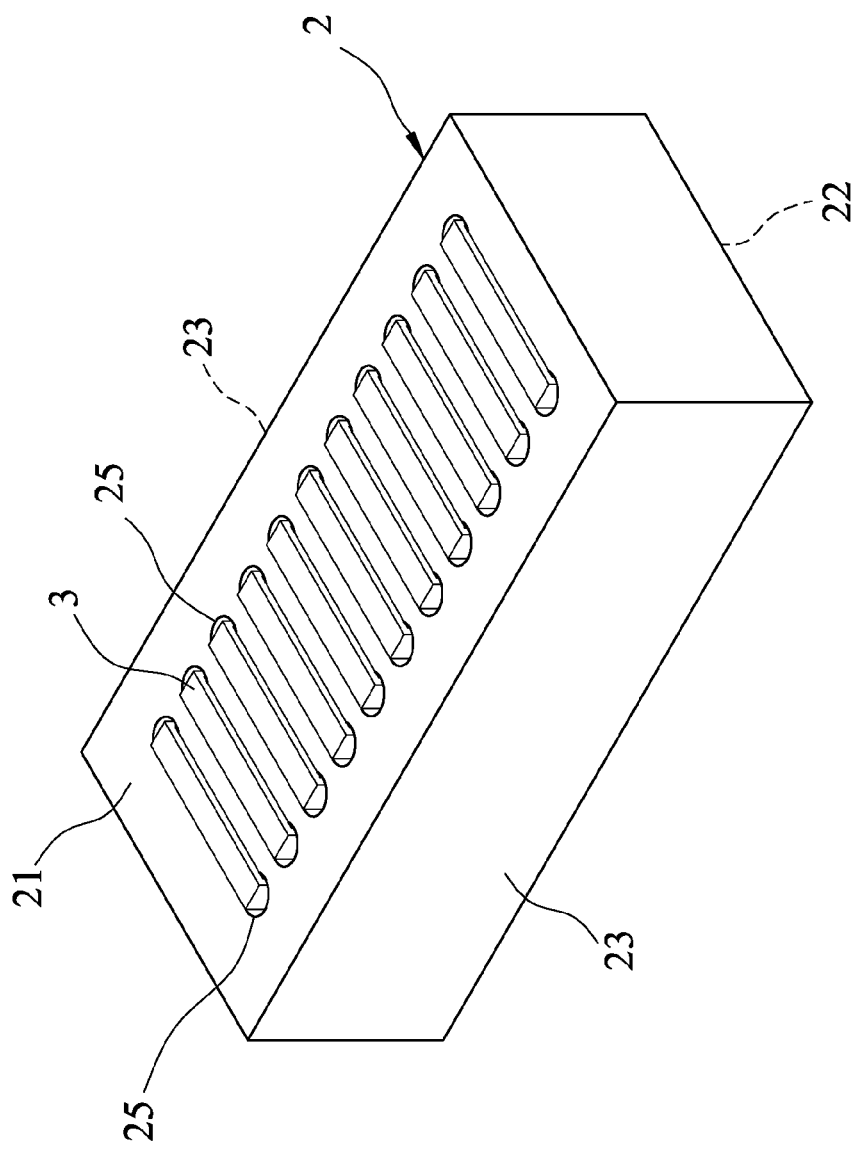
FIG. 5 is a perspective view illustrating the third embodiment of the magnetic core inductor chip according to the disclosure.

Referring to FIG. 5, a third embodiment of the magnetic core inductor chip according to the disclosure differs from the first embodiment in that the core 2 of the third embodiment further includes a plurality of spaced apart holes 25 that extend through the top surface 21 and the bottom surface 22 and that are disposed between the side surfaces 23. The first coil 3 extends into and through the holes 25.

Figure 6:
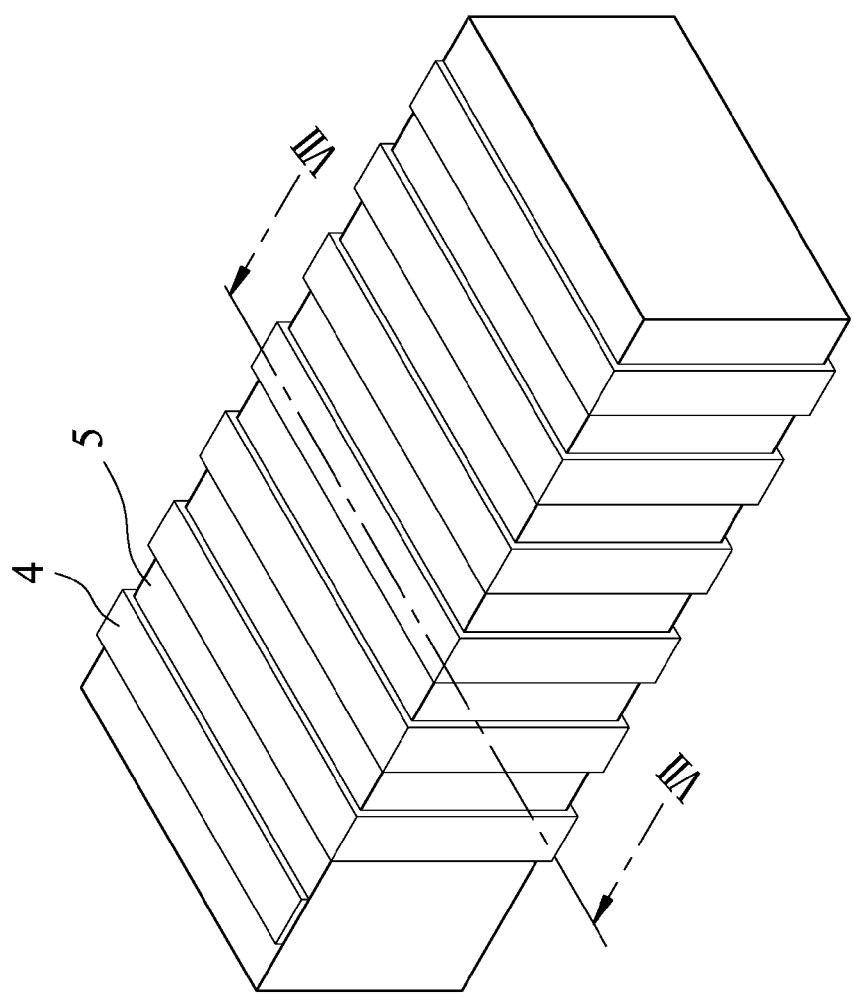
FIG. 6 is a perspective view illustrating the fourth embodiment of the magnetic core inductor chip according to the disclosure.
Figure 7:
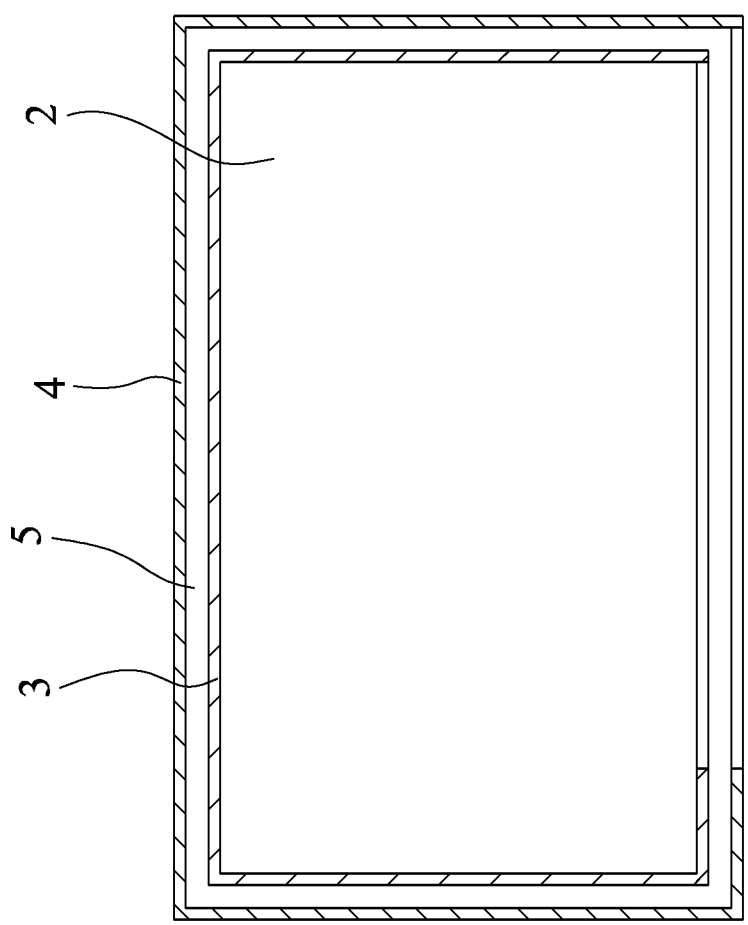
FIG. 7 is a sectional view taken along line VII-VII of FIG. 6.

Referring to FIGS. 6 and 7, a fourth embodiment of the magnetic core inductor chip according to the disclosure differs from the first embodiment in that the fourth embodiment further includes an insulator layer 5 and a second coil 4. The insulator layer 5 is disposed on and encloses the first coil 3 and the core 2, and the second coil 4 is disposed on and surrounds the insulator layer 5 at a position corresponding to the position of the first coil 3.

In certain embodiments, the second coil 4 includes a second seed layer (not shown) deposited on the insulator layer 5, and a second metal layer (not shown) that is deposited on the second seed layer through deposition techniques, e.g., plating techniques.

It is noted that the production of the magnetic core inductor chip of the disclosure may use MEMS manufacturing techniques.

The following description illustrates a method of making the magnetic core inductor chip of the first embodiment of the disclosure, and should not be construed as limiting the scope of the disclosure. The method includes the steps of S1 to S8.

Figure 8:
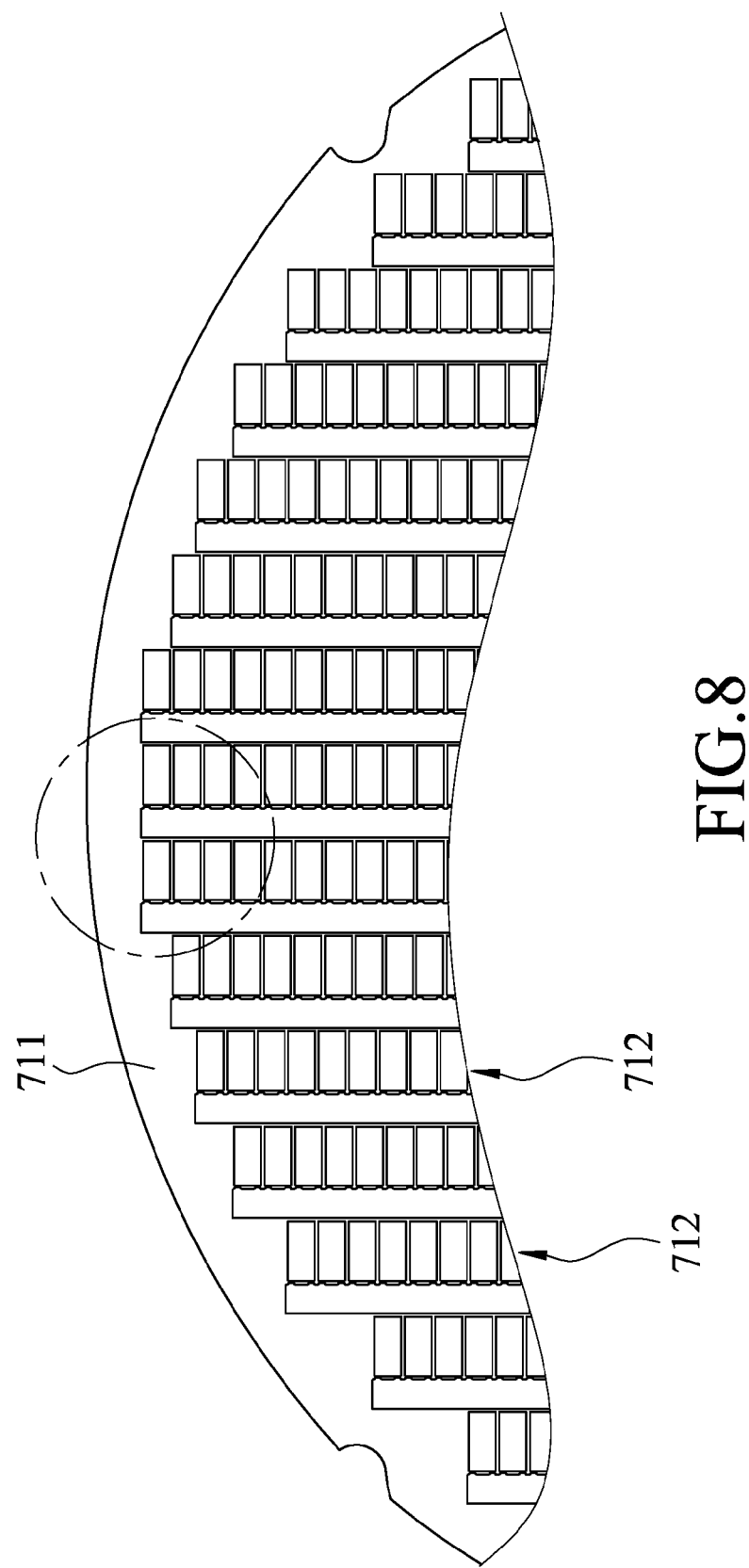
FIG. 8 is a fragmentary top view illustrating step S1 of a method of making the first embodiment of the magnetic core inductor chip according to the disclosure.

In step S1 (see FIGS. 8, 9 and 10), at least one first patterned photoresist layers 71 is formed on a magnetic wafer 60, such that the magnetic wafer 60 has an etched portion 600 exposed from the first patterned photoresist layer 71. The first patterned photoresist layer 71 has a peripheral end part 711 and at least one passive-component-defining unit 712, the passive-component-defining unit 712 having a connecting part 7121 connected to the peripheral end part 711, a plurality of breaking-line-defining protrusions 7122 protruding from the connecting part 7121, and a plurality of chip-defining parts 7123.

Figure 9:
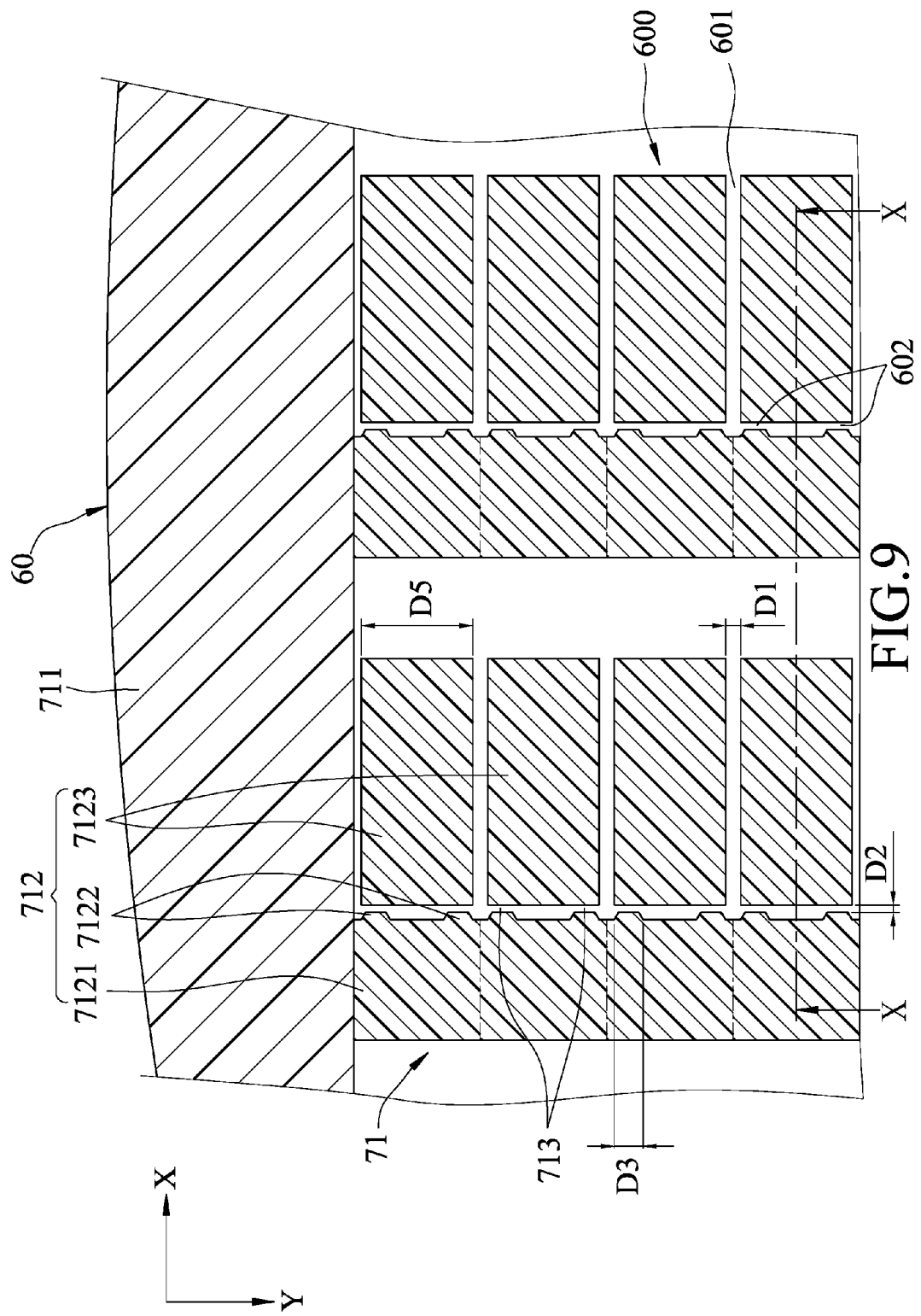
FIG. 9 is an enlarge view of an encircled portion in FIG. 8.

As shown in FIG. 9, each of the breaking-line-defining protrusions 7122 are aligned with a respective one of the chip-defining parts 7123 in a first direction (X) and having a width (D3) smaller than that (D5) of the respective one of the chip-defining parts 7123 in a second direction (Y) that is perpendicular to the first direction (X).

Figure 10:
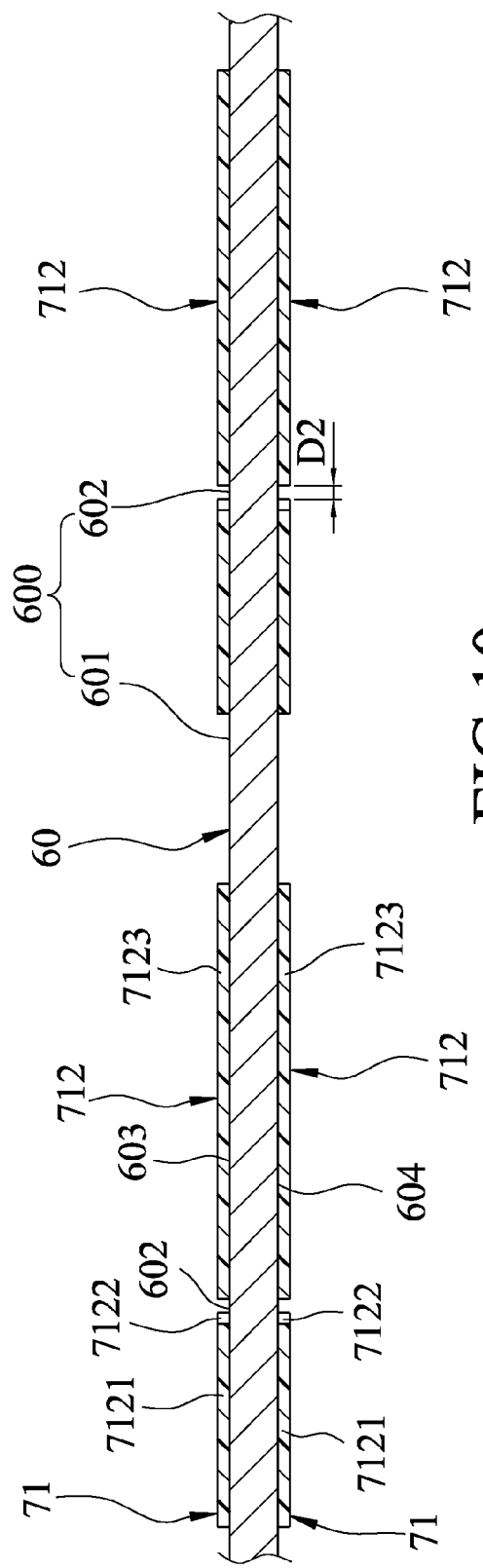
FIG. 10 is a sectional view taken along lines X-X of FIG. 9.

In the method of making the first embodiment, two first patterned photoresist layers 71 are respectively formed on top and bottom surfaces 603, 604 of the wafer 60, and the first patterned photoresist layers 71 formed on the top and bottom surfaces are symmetrical to each other (see FIG. 10).

It should be noted that each of the breaking-line-defining protrusions 7122 may be connected to or spaced apart from a respective one of the chip-defining parts 7123.

As shown in FIGS. 9 and 10, in this embodiment, each of the breaking-line-defining protrusions 7122 is spaced apart from a respective one of the chip-defining parts 7123. As such, the etched portion 600 of the magnetic wafer 60 is designed to have a plurality of to-be-fully-etched regions 601 and a plurality of to-be-partially-etched regions 602. Each of the breaking-line-defining protrusions 7122 is spaced apart from a respective one of the chip-defining parts 7123 by a gap 713. The gaps 713 which are defined by the breaking-line-defining protrusions 7122 and the chip-defining parts 7123 are respectively aligned with the to-be-partially-etched regions 602 so as to expose the to-be-partially-etched regions 602 therefrom. Since the to-be-partially-etched regions 602 have a width (D2) in the first direction (X) significantly less than that (D1) of the to-be-fully-etched regions 601 in the second direction (Y), the to-be-partially-etched regions 602 have an etching rate lower than that of the to-be-fully-etched regions 601.

As mentioned above, the first patterned photoresist layers 71 formed on the top and bottom surfaces 603, 604 are symmetrical to each other, so that the to-be-partially-etched regions 602 and the to-be-fully-etched regions 601 of the top surface 603 are symmetrical to the to-be-partially-etched regions 602 and the to-be-fully-etched regions 601 of the bottom surface 604.

Figure 11:
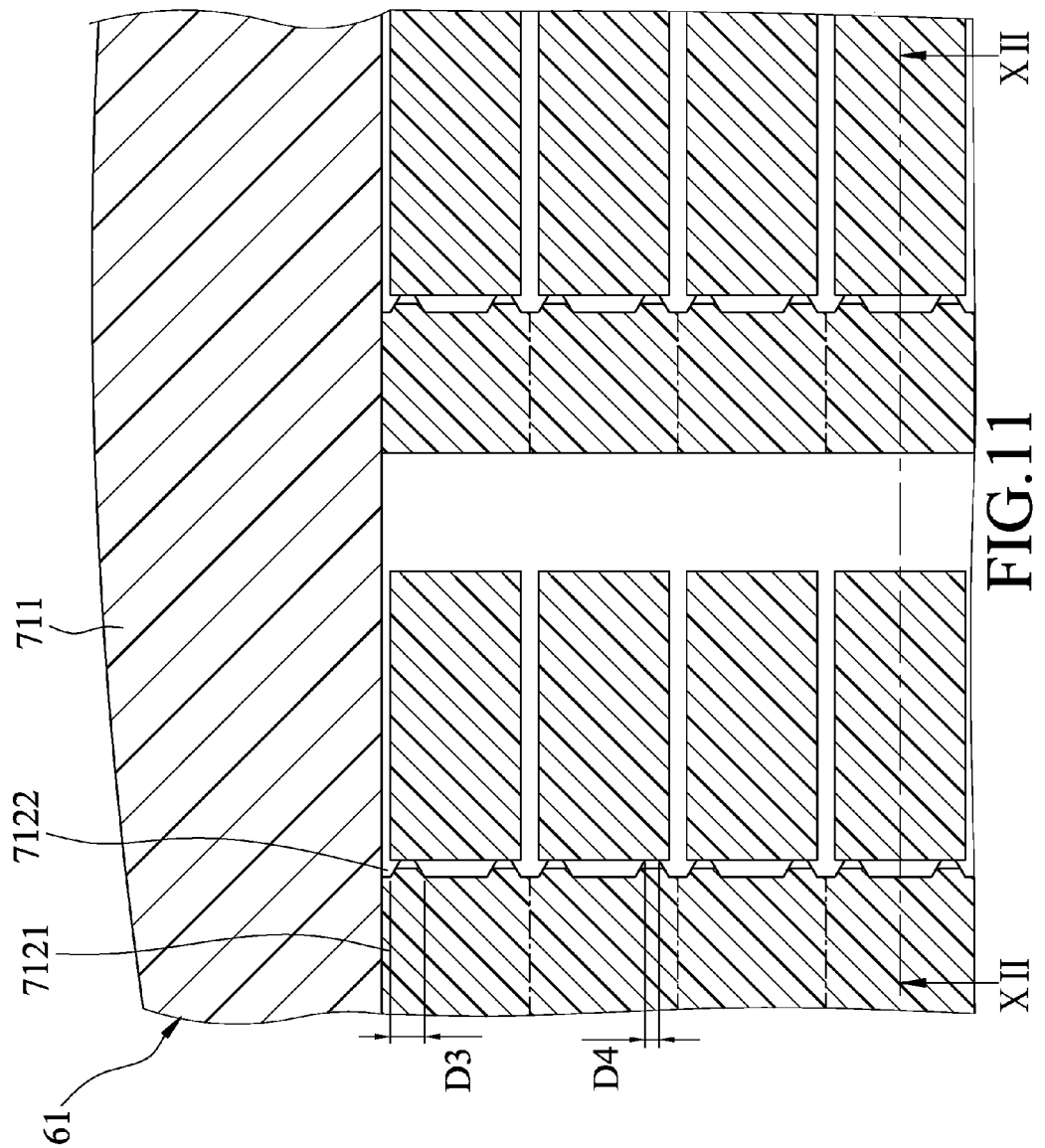
FIG. 11 is a fragmentary top view illustrating step S2 of the method of making the first embodiment of the magnetic core inductor chip according to the disclosure.

As shown in FIG. 11, in step S2, the etched portion 600 is etched by chemical etching or sandblasting so as to pattern the magnetic wafer 60. In detail, the to-be-partially-etched regions 602 and the to-be-fully-etched regions 601 of the top and bottom surfaces 603, 604 of the magnetic wafer 60 are simultaneously etched, such that the magnetic wafer 60 is patterned so as to form a magnetic patterned wafer 61.

Figure 13:
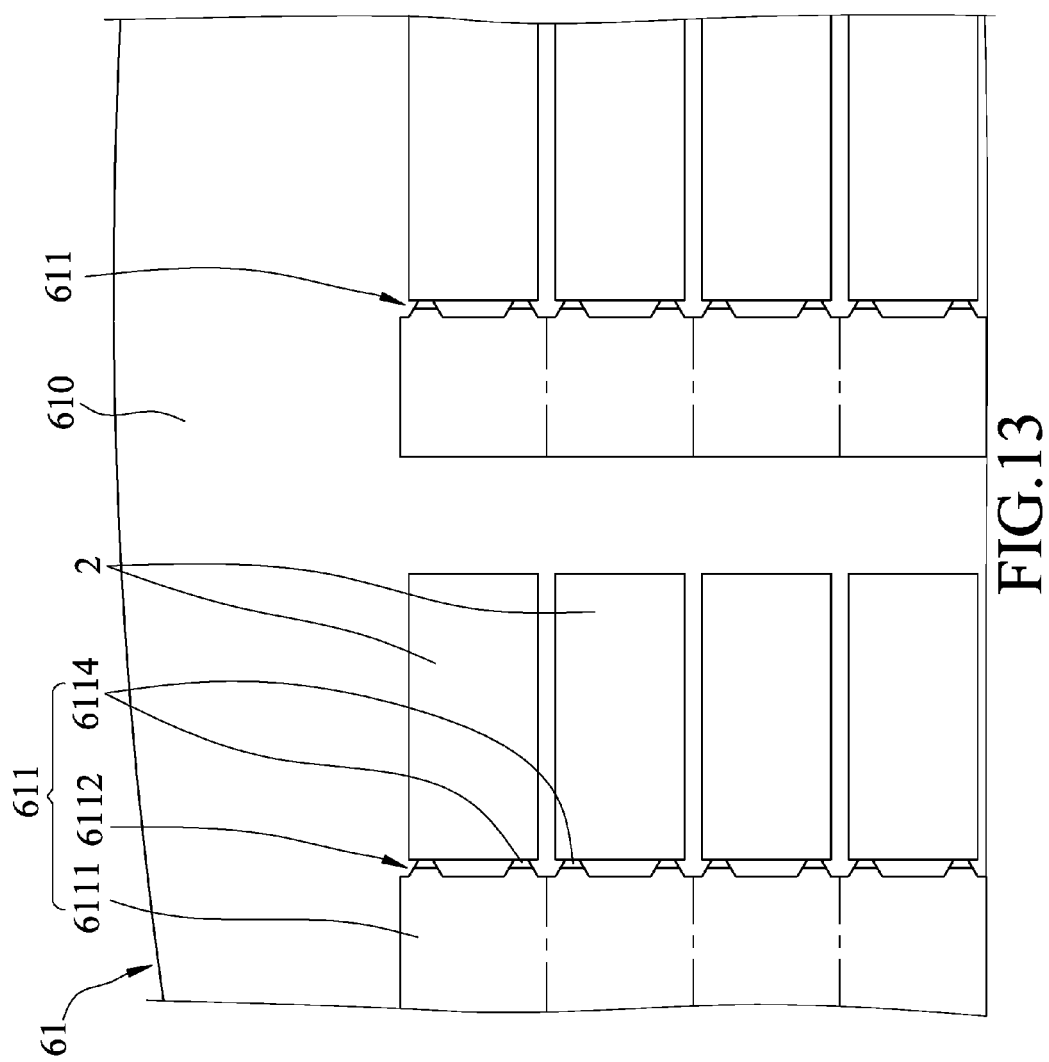
FIG. 13 is a fragmentary top view illustrating step S3 of the method of making the first embodiment of the magnetic core inductor chip according to the disclosure.

In step S3 (see FIGS. 12 and 13), the first patterned photoresist layer 71 is removed from the magnetic patterned wafer 61. The magnetic patterned wafer 61 has a peripheral end portion 610 and at least one passive-component unit 611 that includes a connecting portion 6111, a breaking line 6112, and a plurality of spaced apart chip bodies 2. The connecting portion 6111 is connected to the peripheral end portion 610. The breaking line 6112 has a plurality of connecting tabs 6114 that are spaced apart from one another. Each of the connecting tabs 6114 is disposed between and interconnects the connecting portion 6111 and a respective one of the chip bodies 2.

It is noted that each of the chip bodies is to serve as the core 2 (see FIG. 3) of the magnetic core inductor chip according to the present disclosure.

The shape of the connecting tabs 6114 thus formed can be controlled based on actual requirements by varying the shape of the breaking-line-defining protrusions 7122. In one embodiment, referring back to FIGS. 11 and 12, each of the breaking-line-defining protrusions 7122 is disposed between the respective one of the chip-defining parts 7123 and the connecting part 7121, and is reduced in width (D3) from the respective connecting part 7121 toward the corresponding one of the chip-defining parts 7123, so that each of the connecting tabs 6114 thus formed is correspondingly reduced in width (D4) from the connecting portion 6111 toward the respective one of the chip bodies 2.

Figure 14:
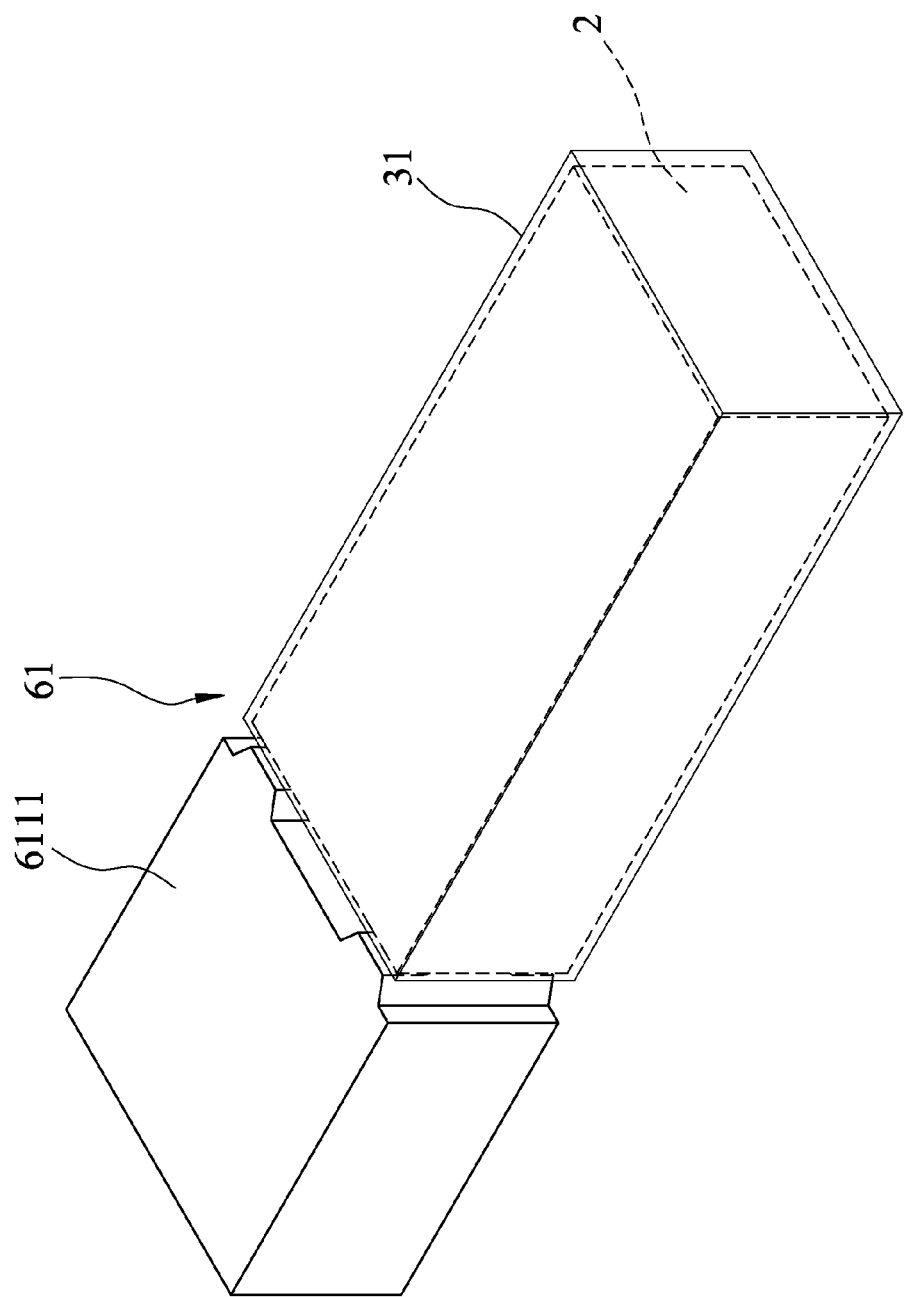
FIGS. 14 to 17 are perspective views illustrating consecutive steps S4 to S7 of the method of making the first embodiment of the magnetic core inductor chip according to the disclosure.

In step S4 (see FIG. 14), a first seed layer 31 is formed on each of the chip bodies 2 of the magnetic patterned wafer 61, such that the first seed layer 31 is disposed on and around each of the chip bodies 2.

Figure 15:
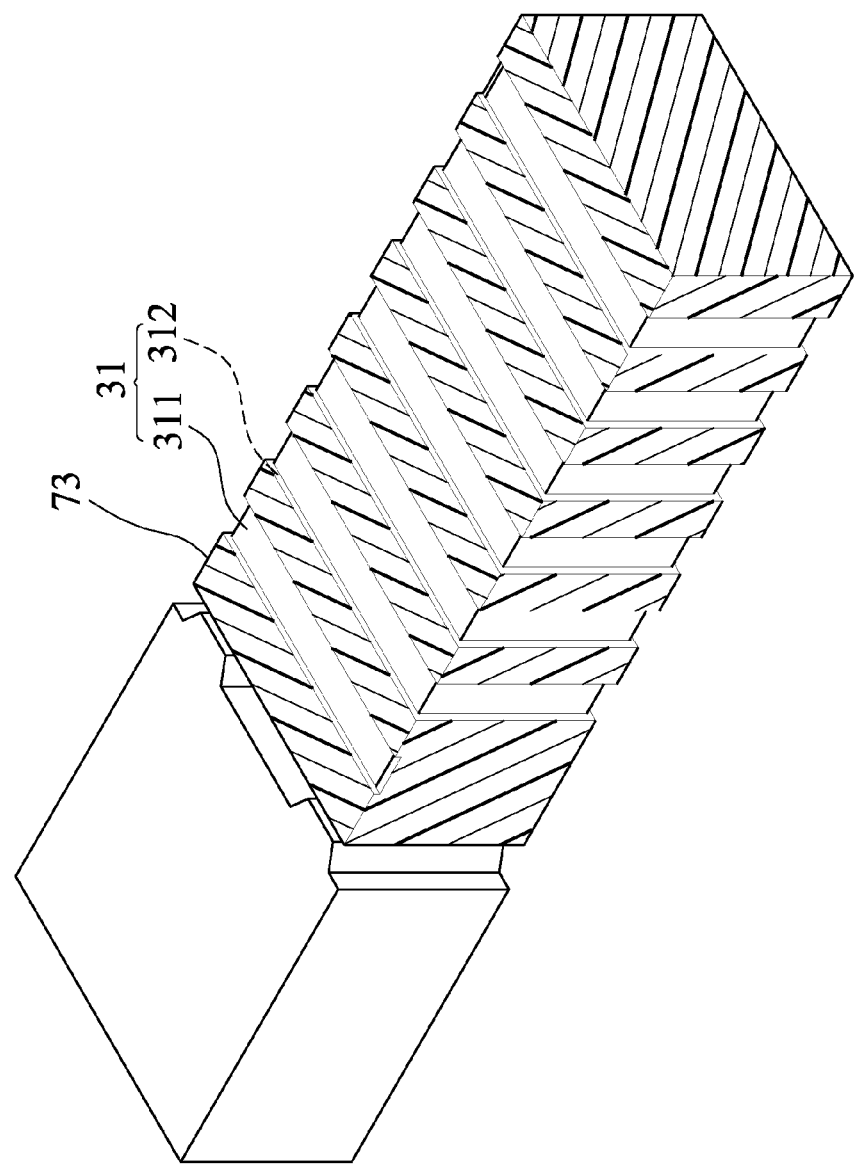

In step S5 (see FIG. 15), a second patterned photoresist layer 73 is formed on the first seed layer 31, such that the first seed layer 31 has a first exposed region 311 that is exposed from the second patterned photoresist layer 73, and a first covered region 312 that is covered with the second patterned photoresist layer 73.

Figure 16:
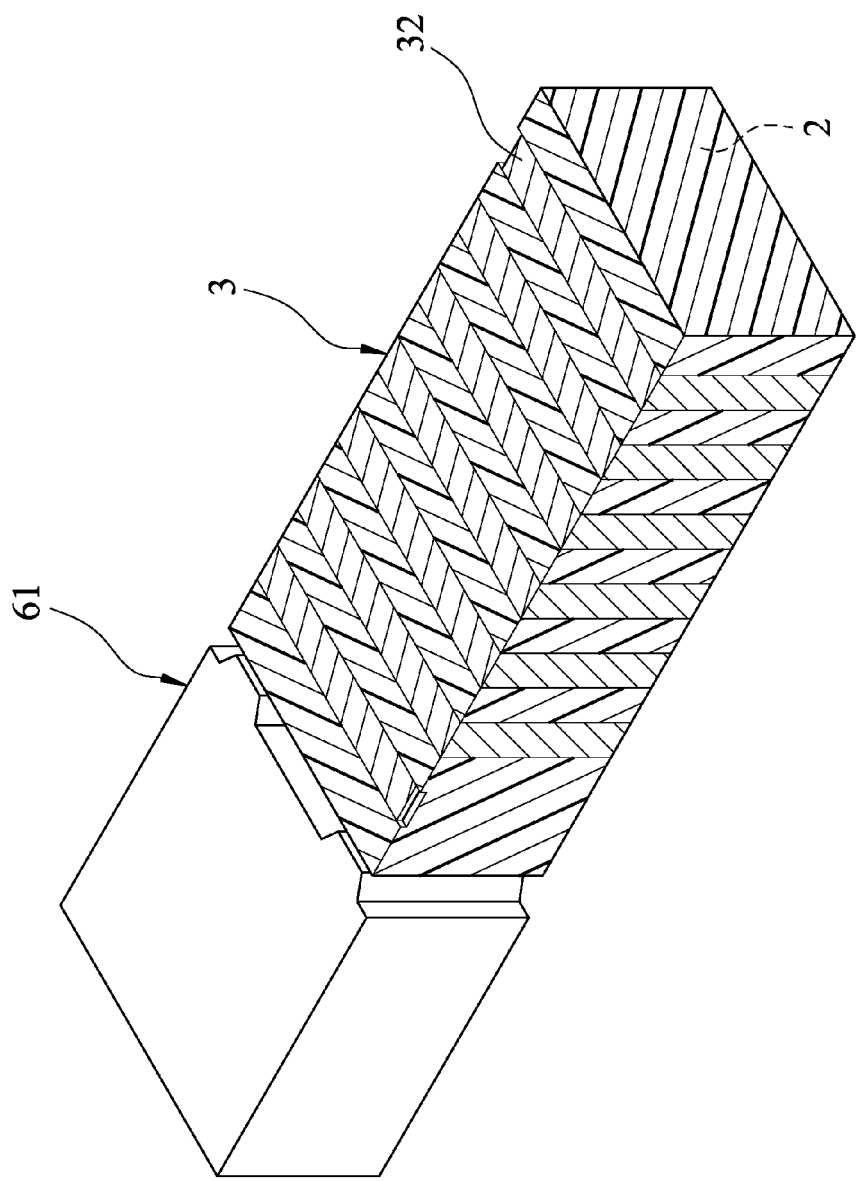

In step S6 (see FIGS. 15 and 16), a first metal layer 32 is deposited on the first exposed region 311 of the first seed layer 31 so as to form a first coil 3 on and around each of the chip bodies 2 of the magnetic patterned wafer 61 through deposition techniques.

The first seed layer 31 may be made from a catalytically active material (e.g., a catalytically active metal) or a conductive material. When the first seed layer 31 is made from the catalytically active material, the first metal layer 32 is formed through chemical plating (or electroless plating) techniques. When the first seed layer 31 is made from the conductive material, the first metal layer 32 is formed through electro-plating techniques. The catalytically active material is selected from the group consisting of Pt, Pd, Au and Ag. The conductive material is selected from the group consisting of Cr, Ni, Ti, W and Mo.

Figure 17:
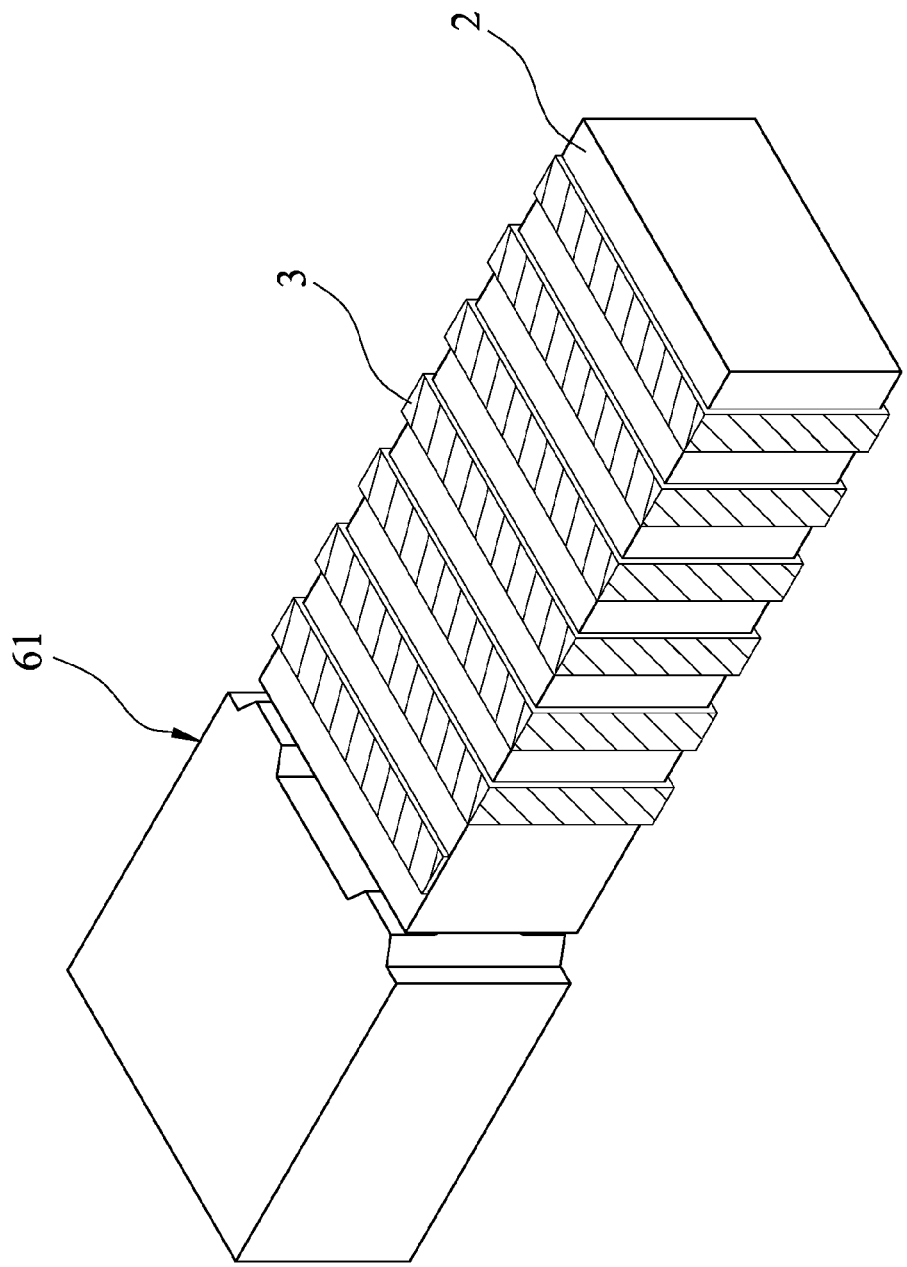

In step S7 (see FIG. 17), the first covered region 312 of the first seed layer 31 (see FIG. 15) is removed from the magnetic patterned wafer 61.

It should be noted that the second patterned photoresist layer 73 (see FIG. 15) is also removed after the deposition of the first metal layer.

Figure 18:
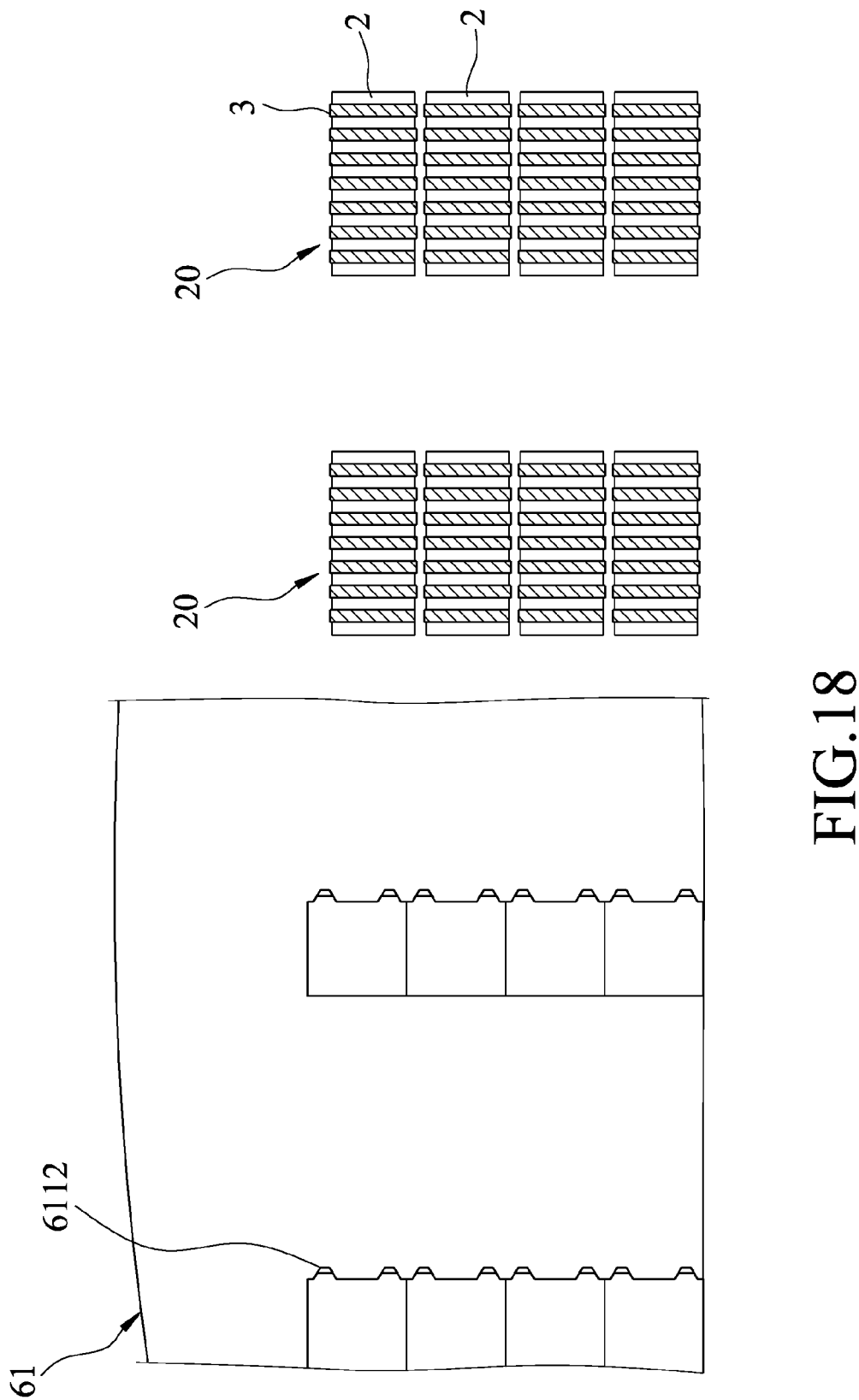
FIG. 18 is a fragmentary top view illustrating step S8 of the method of making the first embodiment of the magnetic core inductor chip according to the disclosure.

In step S8 (see FIG. 18), the patterned wafer 61 is broken along the breaking line 6112 by applying an external force thereto so as to form a plurality of magnetic core inductor chips 20. Alternatively, the magnetic patterned wafer 61 may be broken along the breaking line 6112 using a scriber (not shown) or using etching techniques.

In certain embodiments, when the magnetic wafer 60 is made from a metal, an insulator film (not shown) is needed to be formed on each of the chip bodies 2 before the deposition of the first seed layer 31 thereon so as to prevent short-circuit between each of the chip bodies 2 and the first coil 3.

Figure 19:
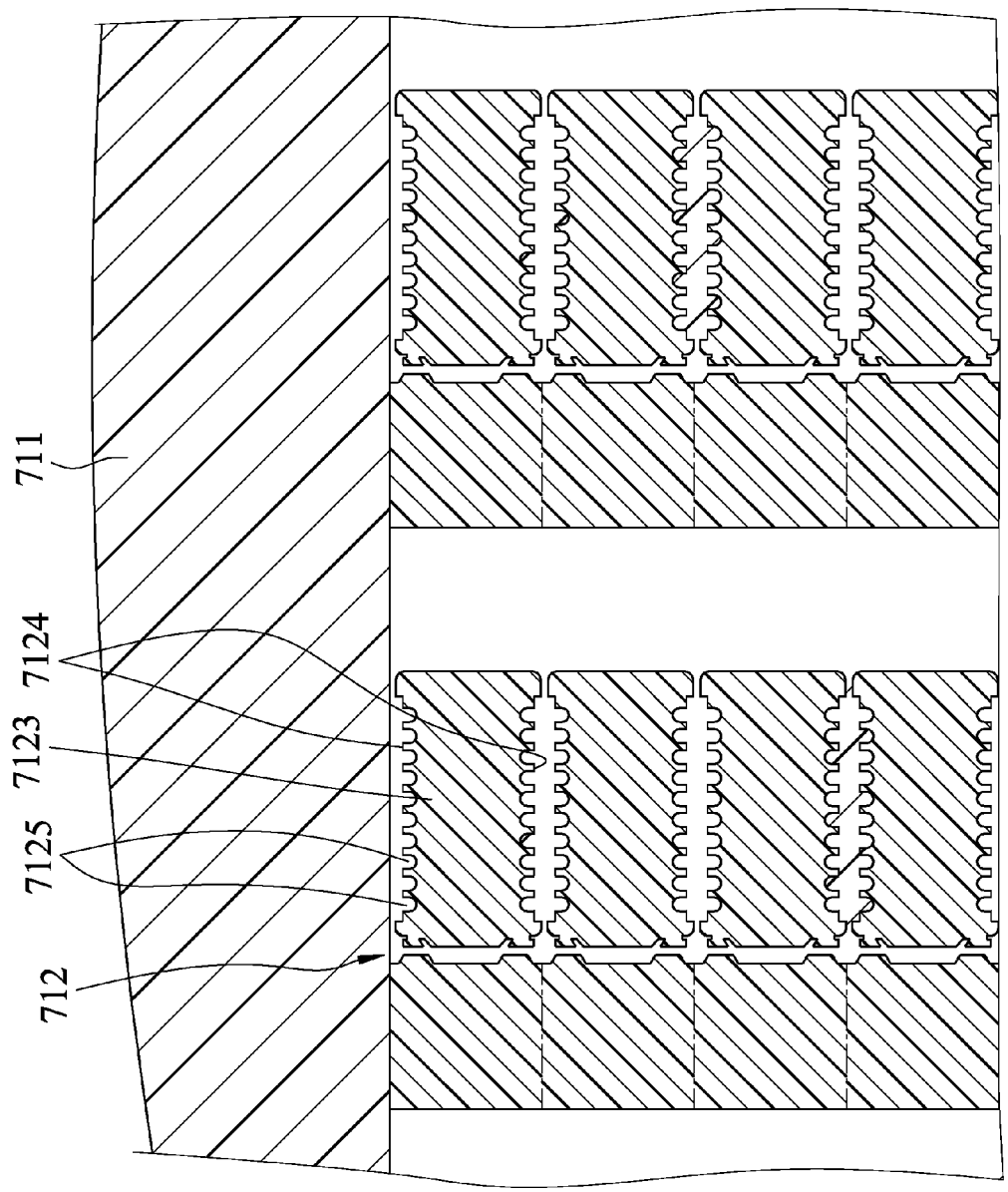
FIG. 19 is a fragmentary top view illustrating step S1 of the method of making the second embodiment of the magnetic core inductor chip according to the disclosure.

Referring to FIG. 19, the method of making the magnetic core inductor chip of the second embodiment (see FIG. 4) differs from the method of making the first embodiment in that the former further includes forming a plurality of notch-defining grooves 7125 that are intended inwardly from side faces 7124 of each chip-defining part 7123, so that after step S2, each of the chip bodies 2 of the magnetic patterned wafer 61 is formed with a plurality of notches 24 and that the first coil 3 is formed to extend into and through the notches 24 (see FIG. 4).

Figure 20:
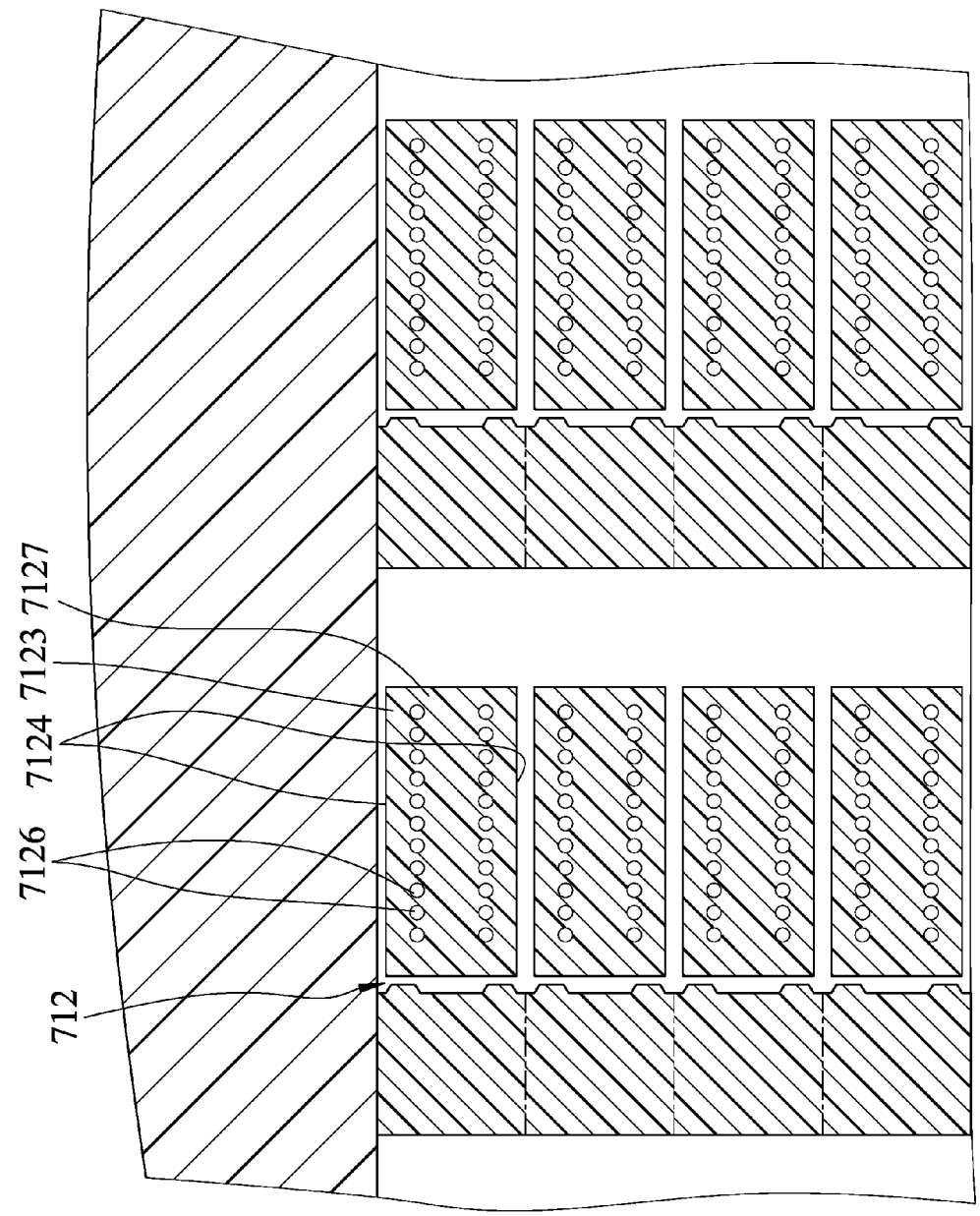
FIG. 20 is a fragmentary top view illustrating step S1 of the method of making the third embodiment of the magnetic core inductor chip according to the disclosure.
Figure 21:
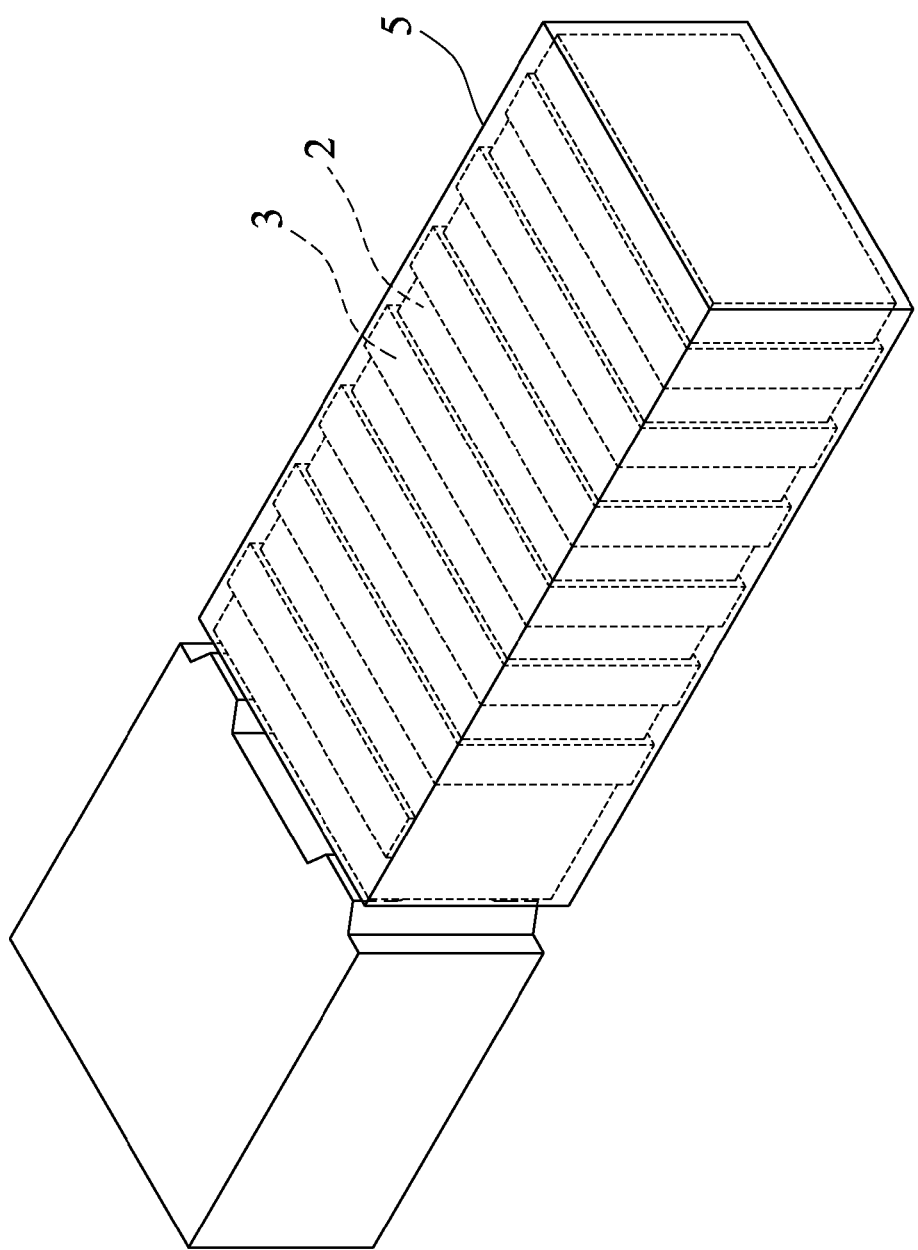
FIGS. 21 to 24 are perspective views illustrating consecutive steps of the method of making the fourth embodiment of the magnetic core inductor chip according to the disclosure.
Figure 22:
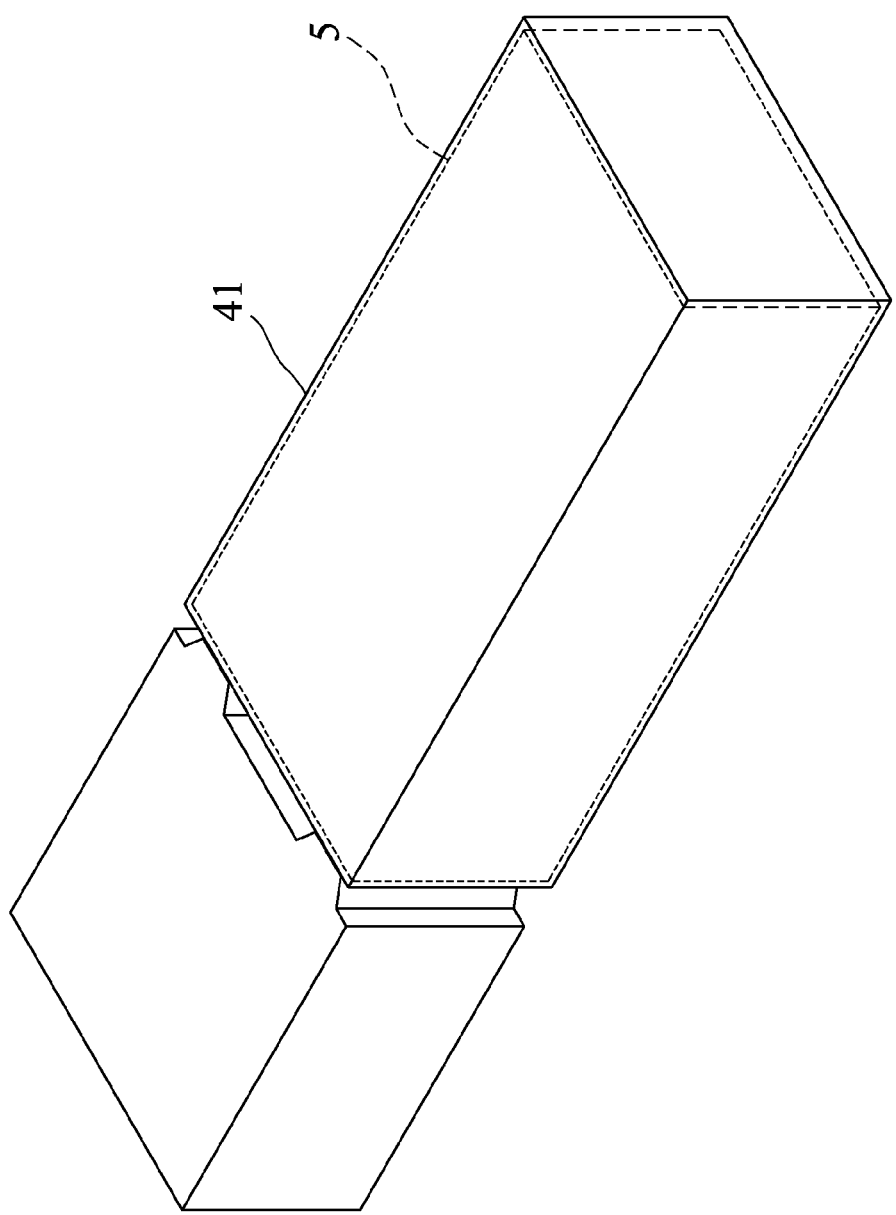
Figure 23:
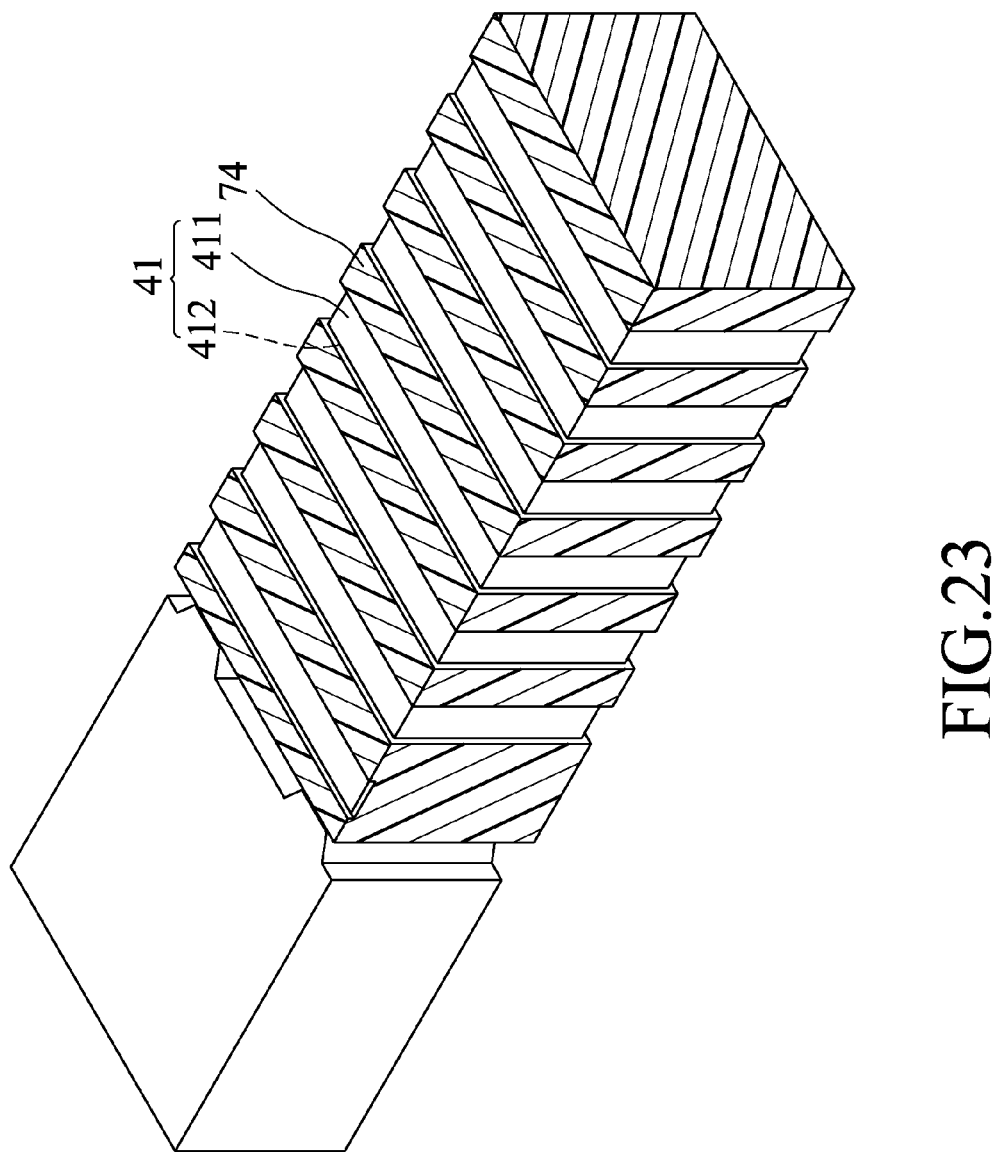
Figure 24:
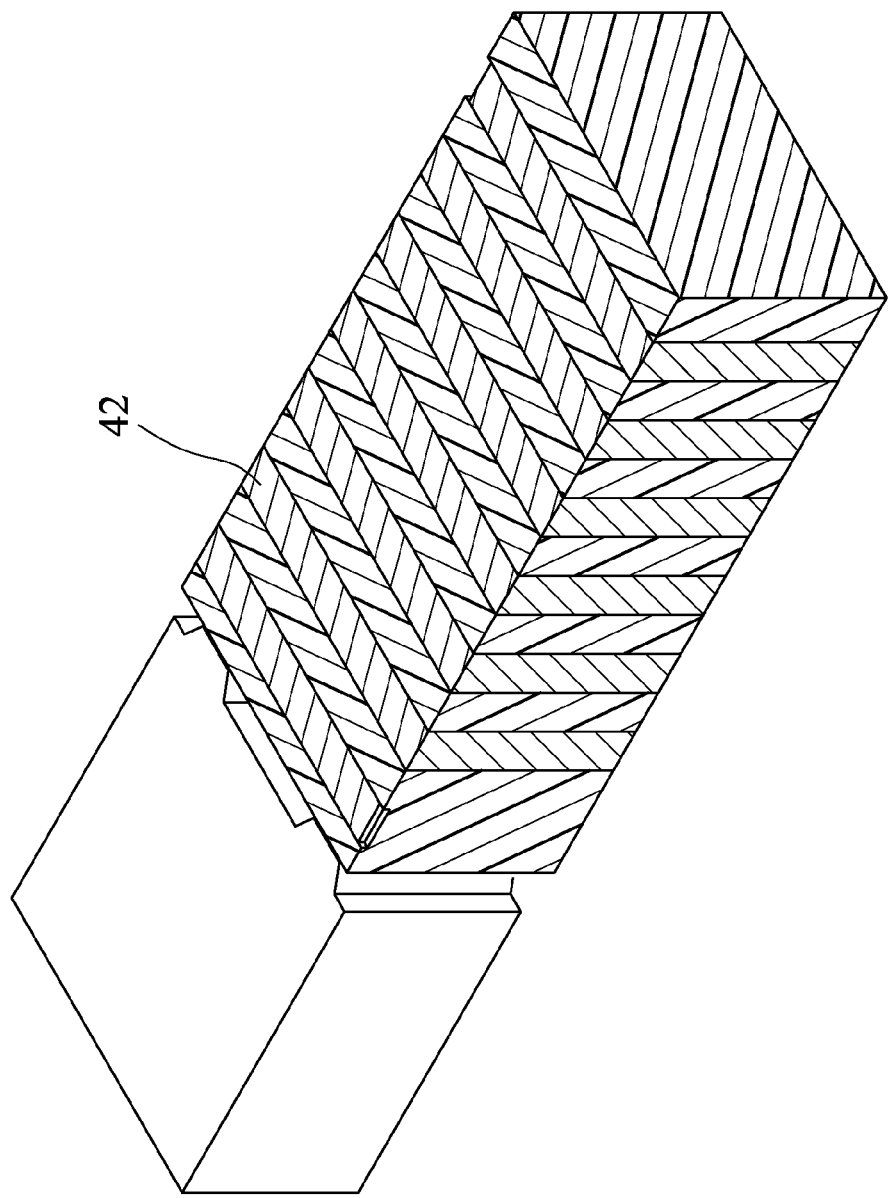

Referring to FIG. 20, the method of making the magnetic core inductor chip of the third embodiment (see FIG. 5) differs from the method of making the first embodiment in that the former further includes forming a plurality of hole-defining through-holes 7126 extending through top face 7127 and bottom face (not shown), and disposed between side faces 7124 of each of the chip-defining parts 7123, so that after step S2, each of the chip bodies 2 of the magnetic patterned wafer 61 is formed with a plurality of spaced apart holes 25 extending through top and bottom surfaces 21, 22 of the core 2 and disposed between the side surfaces 23 of the core 2, and that the first coil 3 is formed to extend into and through the holes 25 (see FIG. 5).

Referring to FIGS. 21 to 24, the method of making the magnetic core inductor chip of the fourth embodiment differs from the method of making the first embodiment in that the former further includes: forming an insulator layer 5 on the first coil 3 and on each of the chip bodies 2; forming a second seed layer 41 on the insulator layer 5; forming a third patterned photoresist layer 74 on the second seed layer 41, such that the second seed layer 41 has a second exposed region 411 that is exposed from the third patterned photoresist layer 74, and a second covered region 412 that is covered with the third patterned photoresist layer 74; depositing a second metal layer 42 on the second exposed region 411 of the second seed layer 41 so as to form a second coil 4 (see FIG. 6) on the insulator layer 5 through deposition techniques (e.g., plating techniques); and removing the third patterned photoresist layer 74 and the second covered region 412 of the second seed layer 41 from the insulator layer 5.

The second seed layer 41 may be made from a catalytically active material or a conductive material. When the second seed layer 41 is made from the made from the catalytically active material, the second metal layer 42 is formed through chemical plating (or electroless plating) techniques. When the second seed layer 41 is made from the conductive material, the second metal layer 42 is formed through electro-plating techniques. The catalytically active material is selected from the group consisting of Pt, Pd, Au and Ag. The conductive material is selected from the group consisting of Cr, Ni, Ti, W and Mo.

Another method of making the magnetic core inductor chip of the first embodiment of the disclosure is illustrated in the following. The method includes the steps of s1 to s7.

Figure 25:
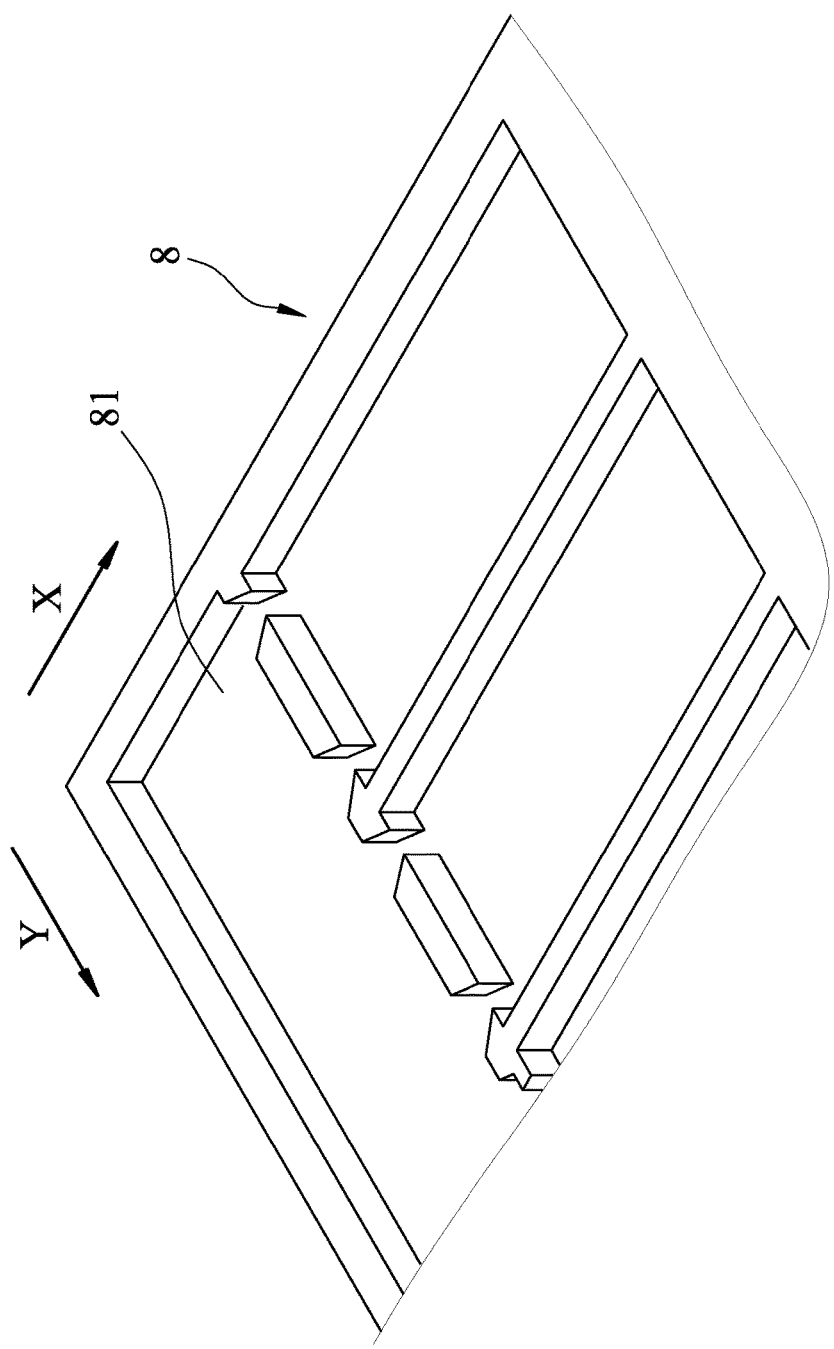
FIG. 25 is a fragmentary top view illustrating a punching die used in step s1 of a method of making the first embodiment of a magnetic core inductor chip according to the disclosure.

In step s1 (see FIG. 25), a punching die 8 having a plurality of die holes 81 that are arranged in an array is provided.

Figure 26:
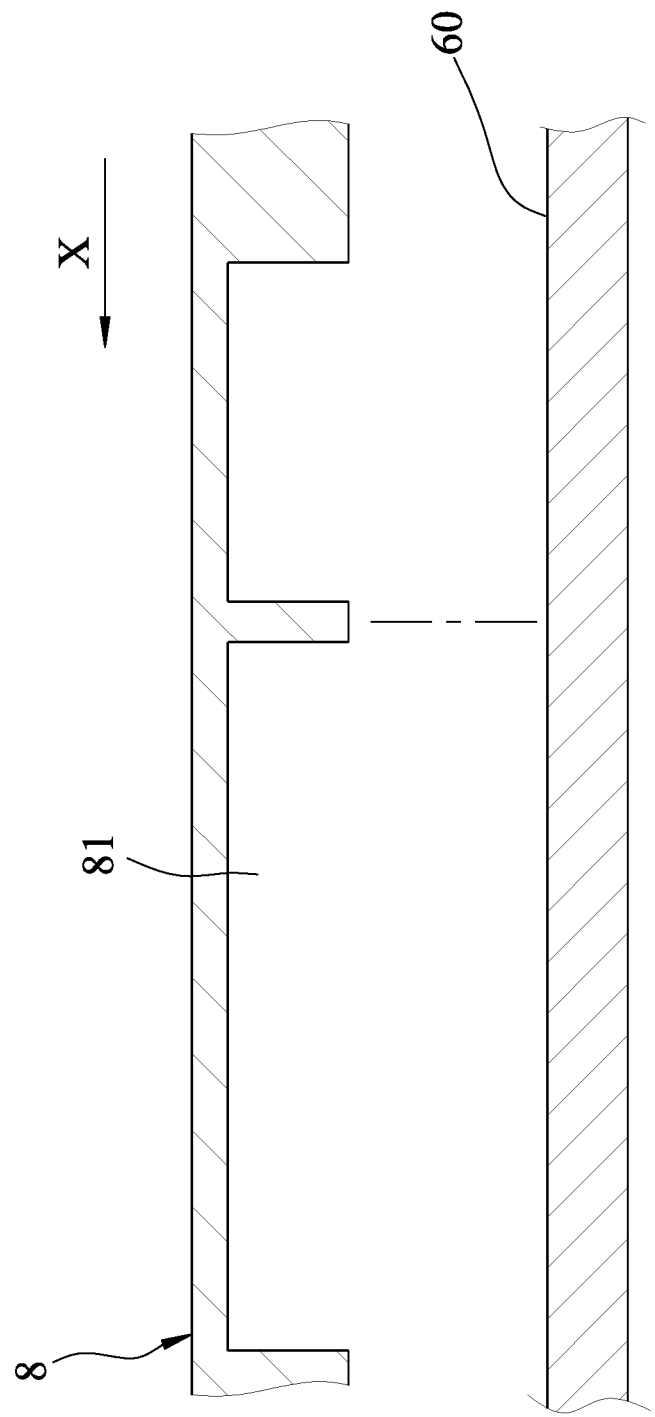
FIGS. 26 and 27 are sectional views illustrating step s2 of the method of making the first embodiment of the magnetic core inductor chip according to the disclosure.
Figure 27:
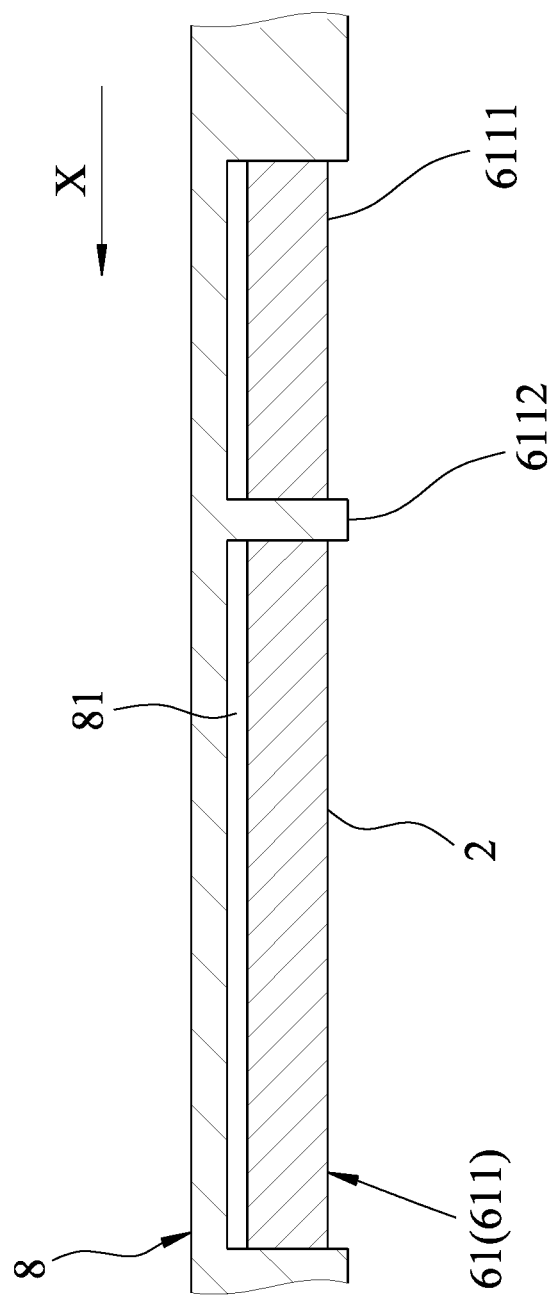

In step s2 (see FIGS. 26 and 27), a magnetic wafer 60 is punched using the punching die 8 so as to form a magnetic patterned wafer 61 that has a peripheral end portion (not shown) and at least one passive-component unit 611, the passive-component unit 611 including a connecting portion 6111, a breaking line 6112, and a plurality of spaced apart chip bodies 2. The connecting portion 6111 is connected to the peripheral end portion (not shown), and is spaced apart from the chip bodies 2 by a tab-accommodating space (not shown) along a first direction (X). Similar to the structure shown in FIG. 13, the breaking line 6112 has a plurality of connecting tabs 6114 that are spaced apart from one another and that are disposed in the tab-accommodating space (not shown). Each of the connecting tabs 6114 interconnects the connecting part 6111 and a respective one of the chip bodies 2.

Figure 28:
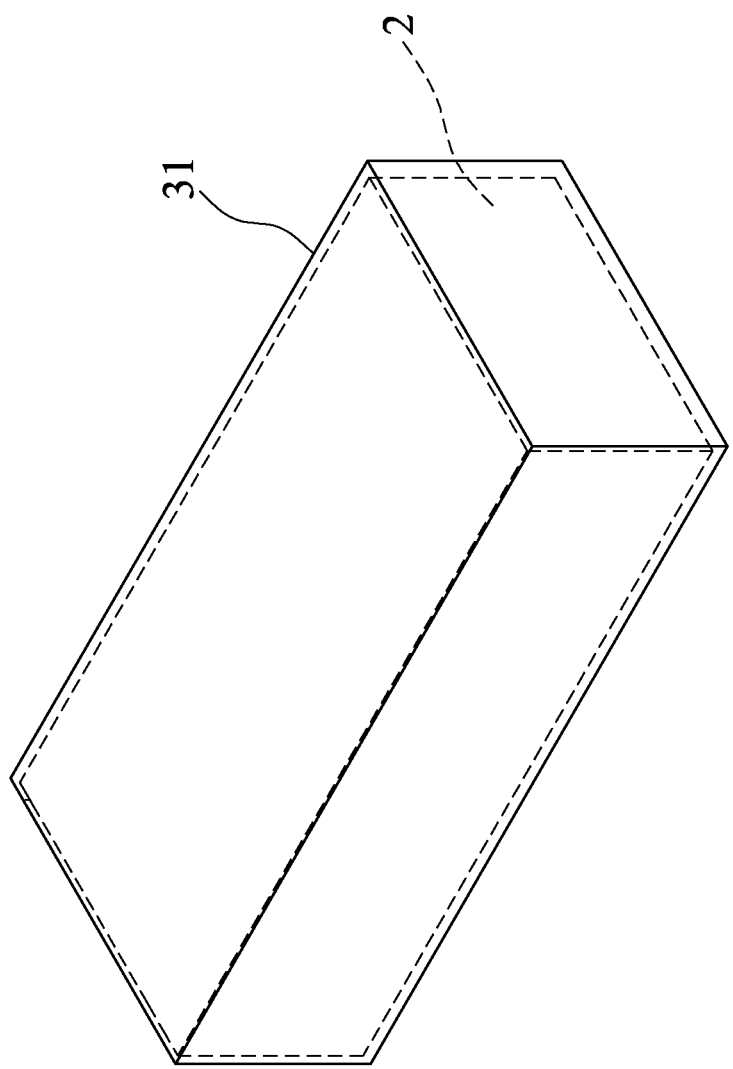
FIGS. 28 to 31 are perspective views illustrating consecutive steps s3 to s6 of the method of making the first embodiment of the magnetic core inductor chip according to the disclosure.

In step s3 (see FIG. 28), a first seed layer 31 is formed on each of the chip bodies 2 of the magnetic patterned wafer 61, such that the first seed layer 31 is disposed on and around each of the chip bodies 2.

Figure 29:
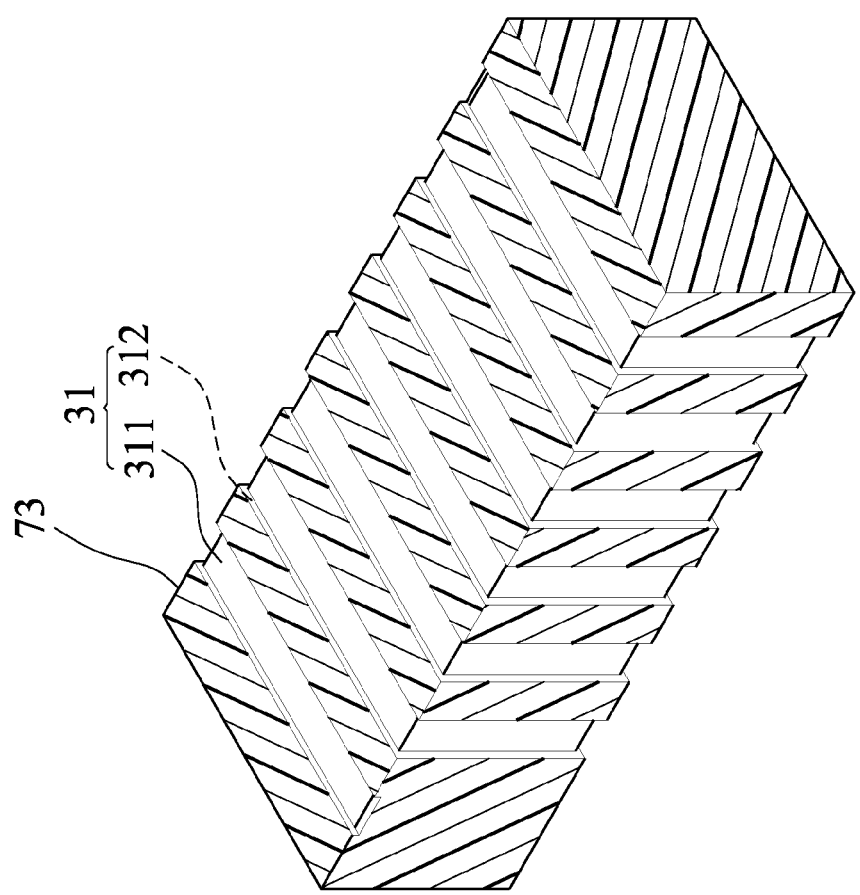

In step s4 (see FIG. 29), a second patterned photoresist layer 73 is formed on the first seed layer 31, such that the first seed layer 31 has a first exposed region 311 that is exposed from the second patterned photoresist layer 73, and a first covered region 312 that is covered with the second patterned photoresist layer 73.

Figure 30:
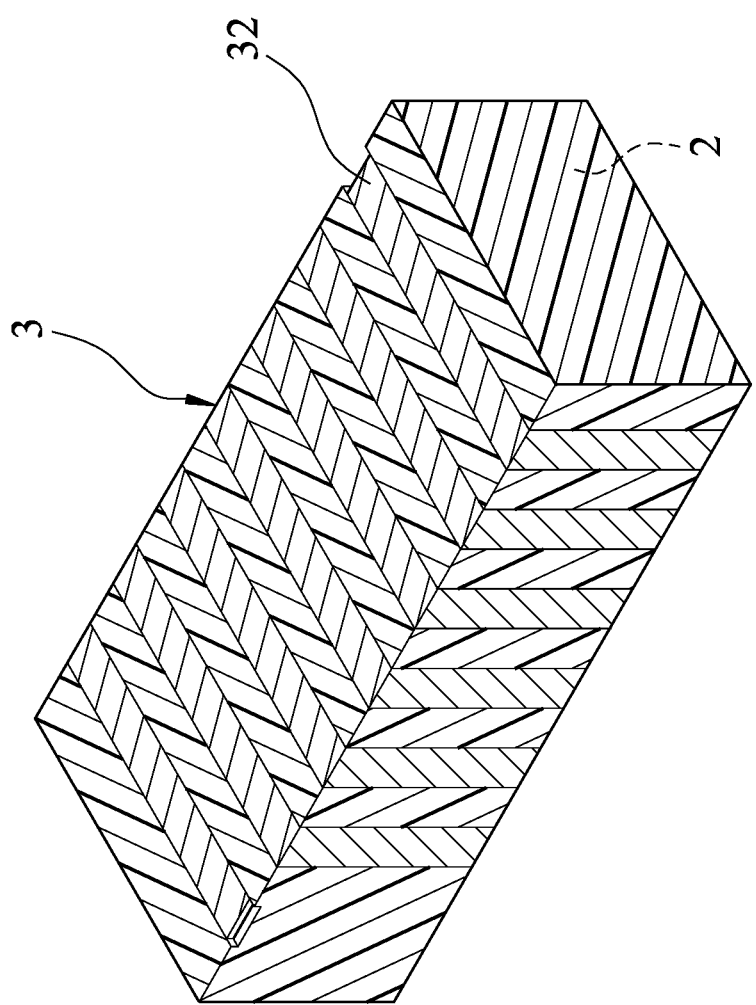

In step s5 (see FIG. 30), a first metal layer 32 is deposited on the first exposed region 311 of the first seed layer 31 so as to form a first coil 3 on and around each of the chip bodies 2 of the magnetic patterned wafer 61 through plating techniques.

Figure 31:
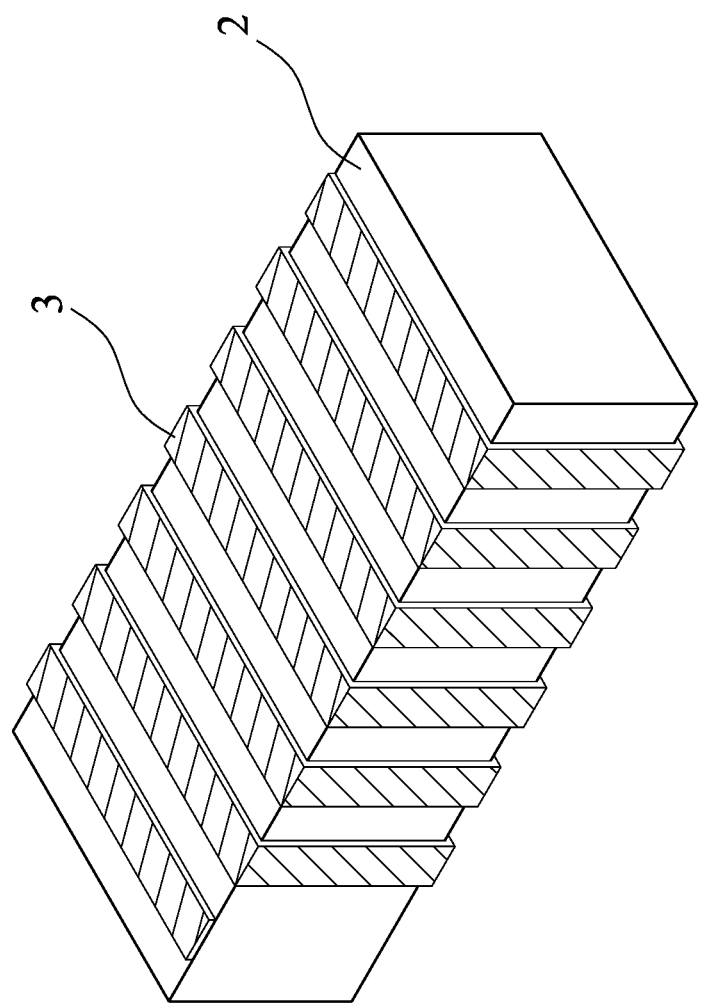

In step s6 (see FIG. 31), the second patterned photoresist layer 73 and the first covered region 312 of the first seed layer 31 is removed from the magnetic patterned wafer 61.

Figure 32:
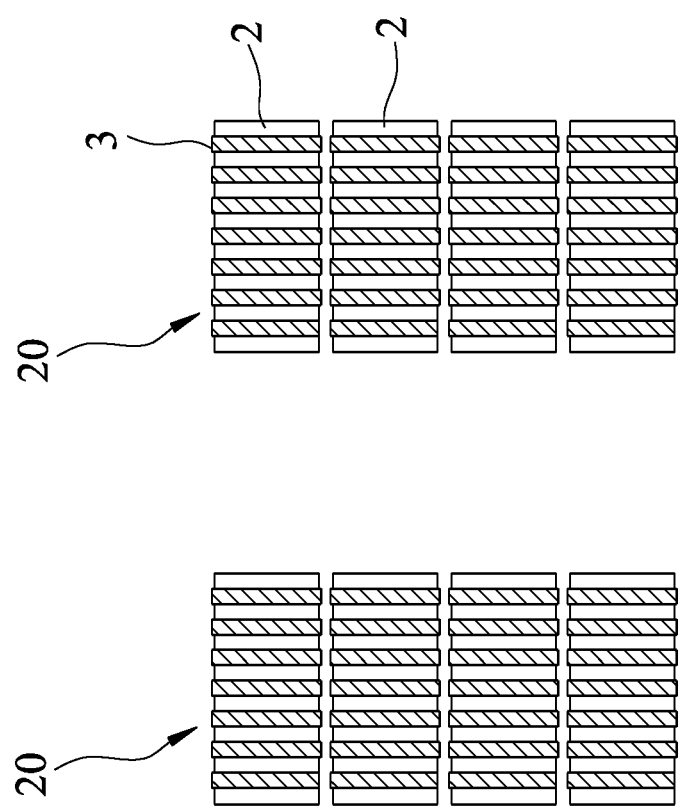
FIG. 32 is a top view illustrating step s7 of the method of making the first embodiment of the magnetic core inductor chip according to the disclosure.

In step s7 (see FIG. 32), the magnetic patterned wafer 61 is broken along the breaking line 6112 so as to form a plurality of magnetic core inductor chips 20.

The magnetic wafer 60 may be made from a magnetic metal material or a magnetic ceramic green. When the magnetic wafer 60 is made from the magnetic ceramic green, the method further comprises sintering the chip bodies 2 after the chip bodies 2 are separated from the connecting portion 6111.

In summary, the methods of the present disclosure may be advantageous over the prior art in reducing the steps of making the magnetic core inductor chip.

Furthermore, the core 2 of the magnetic core inductor chip of the present disclosure is in the form of a single piece. As such, the core 2 of the magnetic core inductor chip of the present disclosure has a higher mechanical strength than that of the conventional multilayered type inductor.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of making a magnetic core inductor chip, comprising:
    forming at least one first patterned photoresist layer on a magnetic wafer such that the magnetic wafer has an etched portion exposed from the first patterned photoresist layer, the first patterned photoresist layer having a peripheral end part and at least one passive-component-defining unit, the passive-component-defining unit having a connecting part connected to the peripheral end part, a plurality of breaking-line-defining protrusions protruding from the connecting part, and a plurality of chip-defining parts;
    etching the etched portion to pattern the magnetic wafer so as to form a magnetic patterned wafer; and
    removing the first patterned photoresist layer from the magnetic patterned wafer, such that the magnetic patterned wafer has a peripheral end portion and at least one passive-component unit that includes a connecting portion, a breaking line, and a plurality of spaced apart chip bodies, the connecting portion being connected to the peripheral end portion, the breaking line having a plurality of connecting tabs that are spaced apart from one another, each of the connecting tabs being disposed between and interconnecting the connecting portion and a respective one of the chip bodies;
    forming a first seed layer on each of the chip bodies of the magnetic patterned wafer, such that the first seed layer is disposed on and around each of the chip bodies;
    forming a second patterned photoresist layer on the first seed layer on each of the chip bodies, such that the first seed layer has a first exposed region that is exposed from the second patterned photoresist layer, and a first covered region that is covered with the second patterned photoresist layer;
    depositing a first metal layer on the first exposed region of the first seed layer so as to form a first coil on and around each of the chip bodies of the magnetic patterned wafer through depositing techniques;
    removing the second patterned photoresist layer after the deposition of the first metal layer;
    removing the first covered region of the first seed layer from the magnetic patterned wafer; and
    breaking the magnetic patterned wafer along the breaking line so as to form a plurality of magnetic core inductor chips.

2. The method of claim 1, wherein each of the breaking-line-defining protrusions being aligned with a respective one of the chip-defining parts in a first direction and having a width smaller than a width of the respective one of the chip-defining parts in a second direction that is perpendicular to the first direction.

3. The method of claim 1, wherein the magnetic wafer has top and bottom surfaces, each of which is formed with the first patterned photoresist layer, the first patterned photoresist layers formed on the top and bottom surfaces being symmetrical to each other.

4. The method of claim 1, wherein each of the chip-defining parts of the passive-component-defining unit of the first photoresist layer has two opposite side faces and a plurality of notch-defining grooves that are intended inwardly from the side faces, so that after etching, each of the chip bodies of the magnetic patterned wafer being formed with a plurality of notches.

5. The method of claim 1, wherein each of the breaking-line-defining protrusions is disposed between the respective one of the chip-defining parts and the connecting part, each of the breaking-line-defining protrusions being reduced in width from the connecting part toward the corresponding one of the chip-defining parts, such that each of the connecting tabs being reduced in width from the connecting part toward the respective one of the chip bodies is formed correspondingly.

6. The method of claim 1, wherein the magnetic wafer is made from a magnetic material selected from the group consisting of a magnetic metal material and a magnetic ceramic material.

7. The method of claim 1, wherein the etched portion of the magnetic wafer has a plurality of to-be-fully-etched regions and a plurality of to-be-partially-etched regions, each of the breaking-line-defining protrusions being spaced apart from a respective one of the chip-defining parts by a gap, the gaps defined by the breaking-line-defining protrusions and the chip-defining parts being respectively aligned with the to-be-partially-etched regions so as to expose the to-be-partially-etched regions therefrom, each of the to-be-partially-etched regions having an etching rate lower than that of each of the to-be-fully-etched regions.

8. The method of claim 7, wherein the magnetic wafer has top and bottom surfaces, each of which is formed with the first patterned photoresist layer, the first patterned photoresist layers formed on the top and bottom surfaces being symmetrical to each other, the to-be-partially-etched regions and the to-be-fully-etched regions of the top and bottom surfaces of the etched portion of the magnetic wafer being simultaneously etched.

9. The method of claim 7, wherein each of the chip-defining parts of the passive-component-defining unit of the first photoresist layer has top and bottom faces and two opposite side faces and a plurality of hole-defining through-holes that extend through the top and bottom faces and that are disposed between the side faces, so that after etching, each of the chip bodies of the magnetic patterned wafer is formed with a plurality of holes.

10. The method of claim 1, further comprising forming an insulator layer on the first coil on each of the chip bodies; forming a second seed layer on the insulator layer; forming a third patterned photoresist layer on the second seed layer, such that the second seed layer has a second exposed region that is exposed from the third patterned photoresist layer, and a second covered region that is covered with the third patterned photoresist layer; depositing the second metal on the second exposed region of the second seed layer so as to form a second coil on the insulator layer through deposition techniques; and removing the second covered region of the second seed layer from the insulator layer.

11. The method of claim 10, wherein the first and second seed layers are made from a catalytically active material, and the depositing techniques is chemical plating.

12. The method of claim 10, wherein the first and second seed layers are made from a conductive material, and the depositing techniques is electroplating.

* * * * *